(12) United States Patent
Kim et al.

(10) Patent No.: US 12,078,682 B2
(45) Date of Patent: Sep. 3, 2024

(54) METHOD AND APPARATUS FOR ESTIMATING STATE OF BATTERY

(71) Applicant: SAMSUNG ELECTRONICS CO., LTD., Suwon-si (KR)

(72) Inventors: Jinho Kim, Yongin-si (KR); Tae Won Song, Yongin-si (KR); Young Hun Sung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 17/671,770

(22) Filed: Feb. 15, 2022

(65) Prior Publication Data
US 2022/0283227 A1 Sep. 8, 2022

(30) Foreign Application Priority Data

Mar. 3, 2021 (KR) .................. 10-2021-0027942
Jan. 7, 2022 (KR) .................. 10-2022-0002616

(51) Int. Cl.
| G01R 31/36 | (2020.01) |
| G01R 31/367 | (2019.01) |
| G01R 31/3842 | (2019.01) |
| G01R 31/392 | (2019.01) |

(52) U.S. Cl.
CPC ....... *G01R 31/367* (2019.01); *G01R 31/3842* (2019.01); *G01R 31/392* (2019.01)

(58) Field of Classification Search
CPC .............. G01R 31/367; G01R 31/3842; G01R 31/392; G01R 31/389; G01R 31/382
See application file for complete search history.

(56) References Cited

U.S. PATENT DOCUMENTS

| 6,789,026 B2 | 9/2004 | Barsoukov et al. |
| 6,832,171 B2 | 12/2004 | Barsoukov et al. |
| 6,892,148 B2 | 5/2005 | Barsoukov et al. |
| 8,198,863 B1 | 6/2012 | Wortham |
| 8,507,121 B2 | 8/2013 | Saito et al. |
| 8,754,611 B2 | 6/2014 | Greening et al. |

(Continued)

FOREIGN PATENT DOCUMENTS

| CN | 109959876 A | 7/2019 |
| DE | 10 2010 031 050 A1 | 1/2012 |

(Continued)

OTHER PUBLICATIONS

Allam, Anirudh et al., "Online Capacity Estimation for Lithium-Ion Battery Cells via an Electrochemical Model-Based Adaptive Interconnected Observer", IEEE Transactions on Control Systems Technology, 2021, pp. 1636-1651.

(Continued)

*Primary Examiner* — Catherine T. Rastovski
*Assistant Examiner* — Lal C Mang
(74) *Attorney, Agent, or Firm* — NSIP Law

(57) ABSTRACT

A method and apparatus for estimating a state of a battery. The method includes obtaining a measured voltage of a battery from a sensor connected to the battery, obtaining an estimated voltage of the battery from an electrochemical model stored in a memory, estimating an aging variation of the battery based on the measured voltage and the estimated voltage, and updating an aging parameter of the electrochemical model using the aging variation.

33 Claims, 18 Drawing Sheets

(56) References Cited

U.S. PATENT DOCUMENTS

| | | |
|---|---|---|
| 8,846,233 B2 | 9/2014 | Lee et al. |
| 9,236,748 B2 | 1/2016 | Barsukov et al. |
| 9,660,462 B2 | 5/2017 | Jeon |
| 9,787,118 B2 | 10/2017 | Wortham |
| 9,895,991 B2 | 2/2018 | Kim et al. |
| 9,979,211 B2 | 5/2018 | Barsukov et al. |
| 10,003,106 B2 | 6/2018 | Jeon et al. |
| 10,536,018 B2 | 1/2020 | Jung |
| 2004/0128086 A1 | 7/2004 | Barsoukov et al. |
| 2004/0128089 A1 | 7/2004 | Barsoukov et al. |
| 2004/0220758 A1* | 11/2004 | Barsoukov .......... H01M 50/569 702/63 |
| 2005/0228281 A1* | 10/2005 | Nefos ................ A61B 8/08 600/446 |
| 2013/0225074 A1* | 8/2013 | Charles ............... H04B 5/0037 455/41.1 |
| 2017/0052228 A1* | 2/2017 | Hariharan .......... G01R 31/3842 |
| 2017/0199247 A1* | 7/2017 | Joe .................... G01R 31/3648 |
| 2017/0205469 A1* | 7/2017 | Song .................. G01R 31/392 |
| 2018/0059192 A1 | 3/2018 | Seo et al. |
| 2019/0115769 A1 | 4/2019 | Chen et al. |
| 2021/0223326 A1* | 7/2021 | Sarlashkar ......... G01R 31/3835 |

FOREIGN PATENT DOCUMENTS

| | | | |
|---|---|---|---|
| DE | 102010031050 A1 * | 1/2012 | ......... G01R 31/3624 |
| DE | 10 2016 119 253 A1 | 4/2017 | |
| JP | 5707982 B2 | 3/2015 | |
| JP | 2016-161448 A | 9/2016 | |
| JP | 6033155 B2 | 11/2016 | |
| JP | 2018-4265 A | 1/2018 | |
| JP | 6371415 B2 | 8/2018 | |
| JP | 2020-153922 A | 9/2020 | |
| KR | 10-2018-0116914 A | 10/2018 | |
| KR | 10-1983392 B1 | 5/2019 | |
| KR | 10-2019-0074123 A | 6/2019 | |
| KR | 10-2020-0048648 A | 5/2020 | |

OTHER PUBLICATIONS

Extended European Search Report issued on Jul. 29, 2022, in counterpart European Patent Application No. 22159579.6 (8 Pages in English).

Yu, Ming, et al., "Theory and Implementation of Impedance Track™ Battery Fuel-Gauging Algorithm in bq2750x Family", Texas Instruments Application Note (SLUA450) (2008).

Hemel, Armijn, et al., "Finding software license violations through binary code clone detection", Proceedings of the 8th Working Conference on Mining Software Repositories. 2011.

Korean Office Action issued on May 31, 2024, in counterpart Korean Patent Application No. 10-2022-0002616 (3 pages in English, 6 pages in Korean).

* cited by examiner

METHOD AND APPARATUS FOR ESTIMATING STATE OF BATTERY

CROSS-REFERENCE TO RELATED APPLICATIONS

This application claims the benefit under 35 USC § 119(a) of Korean Patent Application No. 10-2021-0027942, filed on Mar. 3, 2021, and Korean Patent Application No. 10-2022-0002616, filed on Jan. 7, 2022, in the Korean Intellectual Property Office, the entire disclosures of which are incorporated herein by reference for all purposes.

BACKGROUND

1. Field

The following description relates to a method and apparatus for estimating a state of a battery.

2. Description of Related Art

For battery management, states of batteries may be estimated using various methods. For example, the states of batteries may be estimated by integrating currents of the batteries or by using a battery model (for example, an electric circuit model).

The more often batteries are exposed to a management environment that accelerates aging (e.g., fast charging, fast discharging, low-temperature, or high-temperature environment), the higher the need for predicting state information of batteries reflecting aged states.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a processor-implemented method of estimating a state of a battery includes obtaining a measured voltage of a battery from a sensor connected to the battery, obtaining an estimated voltage of the battery from an electrochemical model stored in a memory, estimating an aging variation of the battery based on the measured voltage and the estimated voltage, and updating an aging parameter of the electrochemical model using the aging variation.

The estimating of the aging variation may include estimating the aging variation based on a response characteristic difference between the estimated voltage of the battery and the measured voltage of the battery.

The estimating of the aging variation may include determining a resistance increase based on a variation in the estimated voltage, a variation in the measured voltage, and a current variation of the battery, and determining a variation in the anodic solid electrolyte interphase (SEI) resistance to be the aging variation based on the resistance increase.

The estimating of the aging variation may include determining a ratio between a response characteristic of the estimated voltage and a response characteristic of the measured voltage according to discharging of the battery to be the aging variation.

The ratio between the response characteristics of the estimated voltage and the response characteristic of the measured voltage may include one of a ratio between a slope determined from estimated voltages and a slope determined from measured voltages at two points within a use interval of the battery, and a ratio between an area determined from estimated voltages and an area determined from measured voltages between two points within a use interval of the battery.

The two points within the use interval of the battery may correspond to a start point and an end point of an OFF-state interval of a corrector with respect to the electrochemical model, or belong to an interval in which a current change of the battery is less than or equal to a first threshold within the OFF-state interval.

The estimating of the aging variation may include estimating the aging variation in response to a corrector with respect to the electrochemical model being controlled to be in an OFF state.

The method may further include controlling an operation state of a corrector with respect to the electrochemical model using state information of the battery estimated by the electrochemical model.

The method may include controlling the corrector to be in an OFF state in response to any one of the state information of the battery, an ion concentration of the battery, and a capacity for active material of the battery being greater than a second threshold or falling within a first range.

The method may include controlling the corrector to be in the OFF state, if any one of the state information of the battery, an ion concentration of the battery, and a capacity for active material of the battery corresponds to an interval in which a change in an anode open circuit potential (OCP) of the battery is less than or equal to a third threshold and a change in a cathode OCP of the battery is greater than or equal to a fourth threshold.

The estimating of the aging variation may include determining a degree in which the state information of the battery is corrected by the corrector to be the aging variation, in response to the corrector being controlled to be in an ON state.

The method may include controlling the corrector to be in the ON state in response to any one of the state information of the battery, an ion concentration of the battery, and a capacity for active material of the battery being less than a fifth threshold or falling within a second range.

The method may include controlling the corrector to be in the ON state, if any one of the state information of the battery, an ion concentration of the battery, and a capacity for active material of the battery corresponds to an interval in which a change in an anode OCP of the battery is greater than or equal to a sixth threshold.

The method may further include storing the aging variation in a memory, and updating the aging parameter using one or more aging variations stored in the memory, in response to an update condition for the aging parameter being reached.

Whether the update condition has been reached may be determined based on one or more of a number of cycles of the battery, a cumulative use capacity of the battery, a cumulative use time of the battery, and a number of aging variations stored in the memory.

The aging parameter may include one or more of an anodic SEI resistance, a capacity for cathode active material, and an electrode balance shift of the battery.

The method may further include estimating state information of the battery using the electrochemical model to which the updated aging parameter is applied.

In another general aspect, an apparatus for estimating a state of a battery includes a memory configured to store an electrochemical model, a sensor configured to measure a voltage of the battery, and a processor configured to estimate an aging variation of the battery based on a measured voltage of the battery and an estimated voltage obtained from the electrochemical model, and update an aging parameter of the electrochemical model using the aging variation.

In another general aspect, a mobile device includes a display, a battery configured to supply power to the display, a memory configured to store an electrochemical model for the battery, and a processor configured to estimate a voltage of the battery using the electrochemical model.

A diagonal length of the display may be 10 centimeters (cm) to 70 cm.

The diagonal length of the display may be 50 cm or less.

A unit cell capacity of the battery may be 10 ampere hours (Ah) or less.

The processor may be a micro controller unit (MCU).

A capacity of a volatile memory included in the memory may be 2 to 8 kilobytes per unit cell.

A capacity of a non-volatile memory included in the memory may be 20 to 100 kilobytes per unit cell.

The mobile device may further include a power management integrated circuit (PMIC), wherein the memory and the processor may be included in the PMIC.

The mobile device may further include a PMIC, wherein the memory and the processor may not be included in the PMIC.

The mobile device may further include a camera configured to capture a user looking at the display.

The mobile device may further include a cover, wherein the battery, the memory, and the processor may be disposed between the cover and the display.

The display may be a touchscreen display configured to detect a touch gesture that is input from a user.

The mobile device may further include a communicator configured to communicate with an external device, wherein the communicator may be further configured to transmit data received from the external device to the processor, or transmit data processed by the processor to the external device.

The mobile device may further include a speaker configured to output a sound according to an operation of the mobile device.

In another general aspect, an apparatus includes a memory configured to store an electrochemical model for a battery; and one or more processors configured to: determine an estimated voltage of a battery using the electrochemical model; measure an actual voltage of the battery; and determine a voltage difference between the estimated voltage of the battery and the actual voltage of the battery; determine a state variation of the battery based on the voltage difference; update an internal state of the electrochemical model using the state variation.

The one or more processors may be configured to update the internal state of the electrochemical model by correcting one or both of an ion concentration distribution within an active material particle or an ion concentration distribution in an electrode based on the state variation of the battery.

The one or more processors may be configured to correcting state information of the battery based on the internal state of the electrochemical model after the electrochemical model has been updated using the state variation.

The one or more processors may be configured to update an aging parameter of the battery based on a degree to which the state information of the battery is corrected.

Other features and aspects will be apparent from the following detailed description, the drawings, and the claims.

Figure 1:
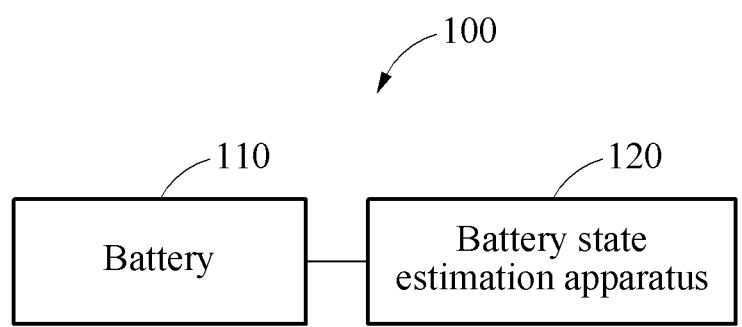
FIG. 1 illustrates an example of a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The following detailed structural or functional description is provided as an example only and various alterations and modifications may be made to the examples. Here, the examples are not construed as limited to the disclosure and should be understood to include all changes, equivalents, and replacements within the idea and the technical scope of the disclosure.

Terms, such as first, second, and the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

It should be noted that if it is described that one component is "connected", "coupled", or "joined" to another component, a third component may be "connected", "coupled", and "joined" between the first and second components, although the first component may be directly connected, coupled, or joined to the second component.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or populations thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Hereinafter, examples will be described in detail with reference to the accompanying drawings. When describing the examples with reference to the accompanying drawings, like reference numerals refer to like elements and a repeated description related thereto will be omitted.

FIG. 1 illustrates an example of a battery system.

Referring to FIG. 1, a battery system 100 includes a battery 110 and a battery state estimation apparatus 120.

The battery 110 may be one or more battery cells, battery modules, or battery packs, and may be a rechargeable battery.

The battery state estimation apparatus 120 may be an apparatus for estimating a battery state for management of the battery 110 and include, for example, a battery management system (BMS). The battery state estimation apparatus 120 collects sensing data by sensing the battery 110 using one or more sensors. For example, the sensing data may include voltage data, current data, and/or temperature data. According to an example, the battery state estimation apparatus 120 may not include a sensor and may receive sensing data from an independent sensor or another device.

The battery state estimation apparatus 120 may estimate state information of the battery 110 based on the sensing data and output the result. The state information may include, for example, a state of charge (SOC), a relative state of charge (RSOC), a state of health (SOH), and/or abnormality state information. A battery model used to estimate the state information is an electrochemical model, which will be described later with reference to FIG. 2.

The battery state estimation apparatus 120 may reflect in the battery model an aged state of the battery 110, thereby estimating state information reflecting the aged state of the battery 110.

There are various aging factors of the battery 110, such as an increase in simple resistance component, a decrease in amount of cathode or anode active material, and an occurrence of lithium (Li) plating. In particular, the aspect of aging may vary depending on a use pattern of a user who uses the battery, and a usage environment. For example, even if the battery 110 has the same reduction in the capacity due to aging, the internal state of the aged battery 110 may be different. In order to more accurately reflect aging in the battery model, aging parameters of the battery estimated through an analysis of response characteristics (for example, voltage, etc.) of the battery aged depending on a user may be updated to the battery model.

Hereinafter, the battery state estimation apparatus 120 will be described in detail with reference to the drawings.

Figure 2:
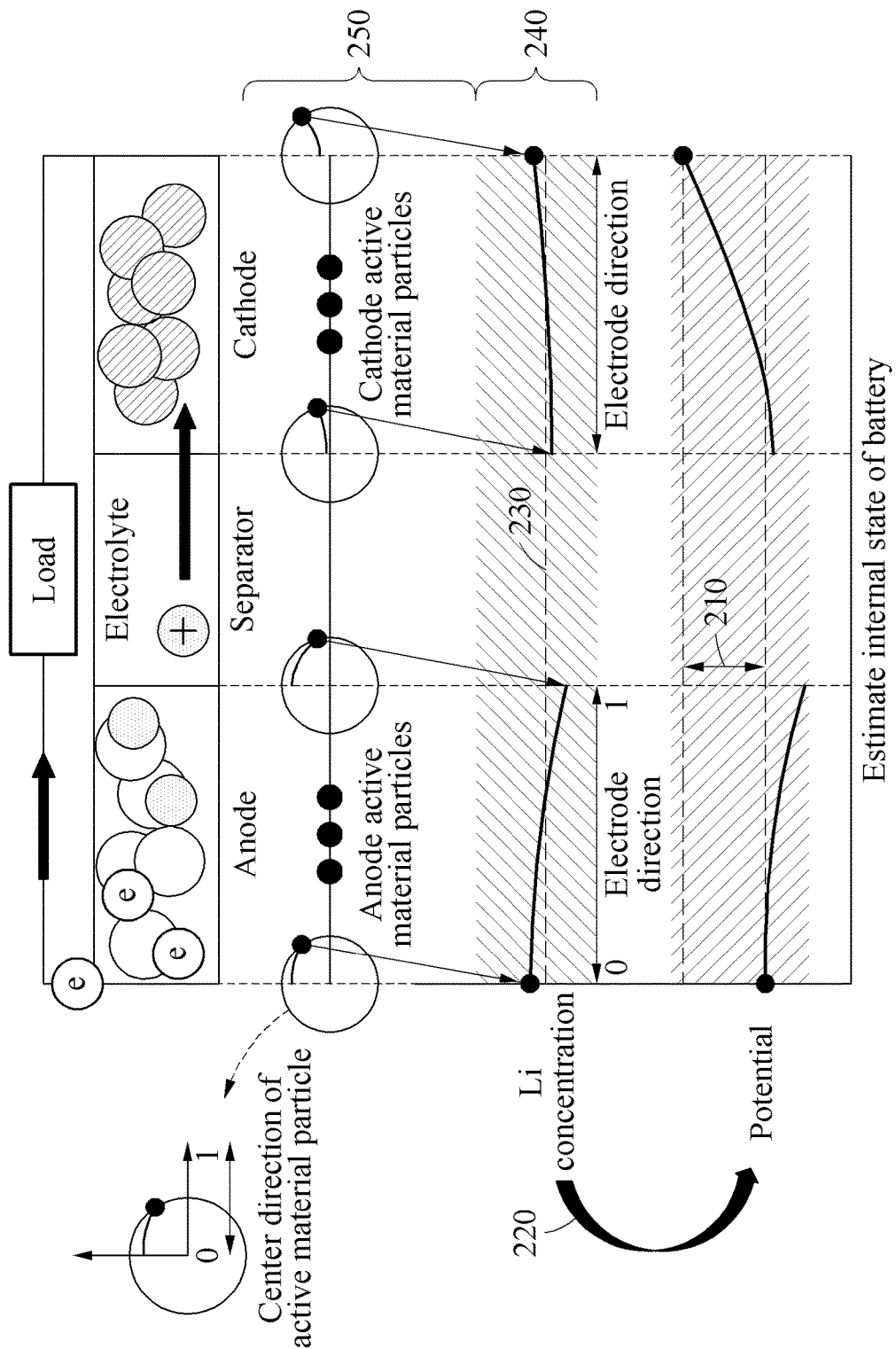
FIG. 2 illustrates an example of an electrochemical model.

FIG. 2 illustrates an example of an electrochemical model.

Referring to FIG. 2, an electrochemical model may estimate a residual capacity of a battery by modeling internal physical phenomena of the battery, such as an ion concentration, a potential, and the like. In other words, the electrochemical model may be represented by a physical conservation equation associated with an electrochemical reaction occurring on an electrode/electrolyte interface, an electrode/electrolyte concentration, and the conservation of electrical charges. For this, various model parameters such as a shape (for example, thickness, radius, etc.), an open circuit potential (OCP), and a physical property value (for example, electrical conductance, ionic conductance, diffusion coefficient, etc.) are used.

In the electrochemical model, various state variables, such as a concentration and a potential, may be coupled to one another. An estimated voltage 210 estimated by the electrochemical model may be a potential difference between both ends, which are a cathode and an anode, and an ion concentration distribution of the cathode and the anode may affect the potential of the cathode and the anode (see 220). In addition, an average ion concentration of the cathode and the anode may be estimated as a SOC 230 of the battery.

The ion concentration distribution may be an ion concentration distribution 240 in an electrode or an ion concentration distribution 250 in an active material particle present at a predetermined position in the electrode. The ion concentration distribution 240 in the electrode may be a surface ion concentration distribution or an average ion concentration distribution of an active material particle positioned in an electrode direction, and the electrode direction may be a direction connecting one end of the electrode (for example, a boundary adjacent to a collector) and the other end of the electrode (for example, a boundary adjacent to a separator). In addition, the ion concentration distribution 250 in the active material particle may be an ion concentration distribution within the active material particle according to a center direction of the active material particle, and the center direction of the active material particle may be a direction connecting the center of the active material particle and the surface of the active material particle.

To reduce the voltage difference between the sensed voltage and the estimated voltage by the corrector, which will be described with reference to FIG. 10, the ion concentration distribution of each of the cathode and the anode may be shifted while maintaining the physical conservation associated with concentration, the potential of each of the cathode and the anode may be derived based on the shifted concentration distribution, and the voltage may be calculated based on the derived potential of each of the cathode and the anode. Through an operation of the corrector deriving an internal state shift that makes the voltage difference between the sensed voltage and the estimated voltage "0", a battery state estimation apparatus may estimate a SOC of the battery at higher accuracy.

Figure 3:
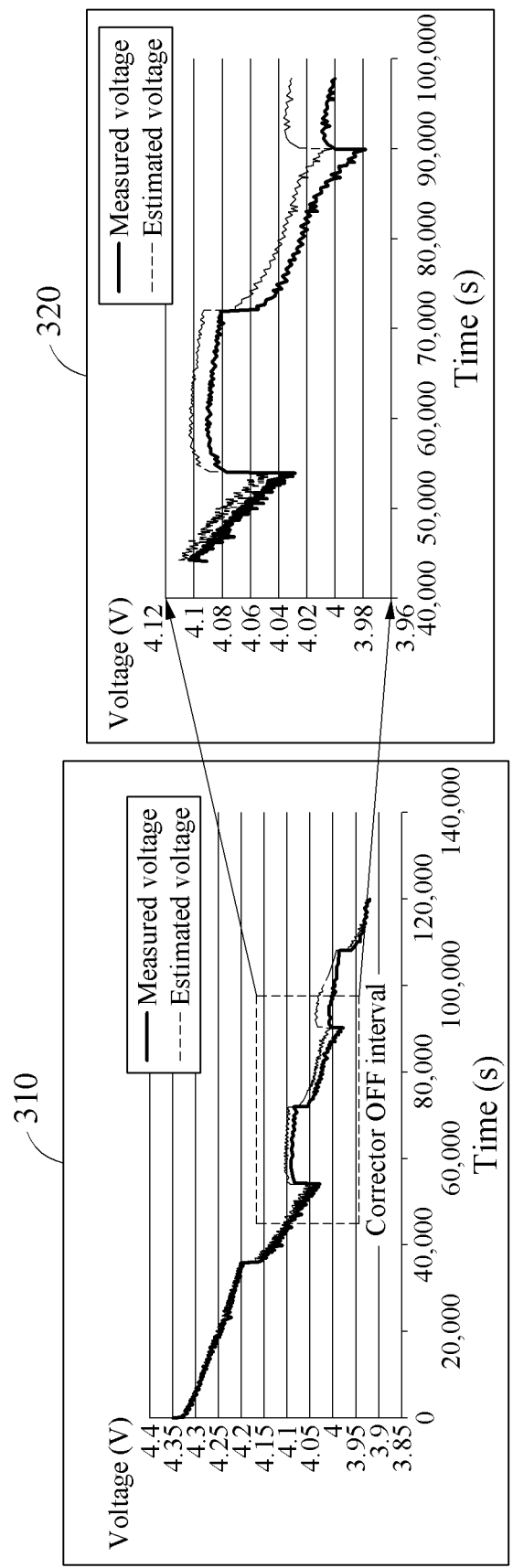
FIG. 3 illustrates an example of a difference between a measured voltage and an estimated voltage.

FIG. 3 illustrates an example of a difference between a measured voltage and an estimated voltage.

Referring to FIG. 3, a measured voltage and an estimated voltage that change as a battery is used and discharged are exemplarily illustrated. In FIG. 3, the measured voltage may be a voltage of a battery measured through a voltage measurer, and the estimated voltage may be a voltage of the battery estimated by a battery model.

Since an initial electrochemical model reflects a fresh state of the battery that is not aged yet, an error between the estimated voltage of the electrochemical model and the measured voltage of the actual battery that is aged may gradually increase as the battery is aged. In addition, even if the electrochemical model reflects an updated aging parameter, an error between the estimated voltage of the electrochemical model reflecting a previous aged state and the measured voltage of the actual battery that is further aged may gradually increase since the battery is continuously aged according to a use pattern or environment.

A second graph 320 shows that the difference between the estimated voltage and the measured voltage gradually increases as the battery is aged. Based on such a response characteristic difference between the estimated voltage and the measured voltage, the battery state estimation apparatus may estimate a variation in the aging parameter and reflect in the electrochemical model the variation. The aging parameter is a parameter indicating an aged state of the battery, among multiple parameters included in the electrochemical model, and may include, for example, one of an anodic solid electrolyte interphase (SEI) resistance, a capacity for cathode active material, and an electrode balance shift, or a combination of two or more thereof.

The second graph 320 may correspond to a portion of the entire use interval of the battery, and voltage changes in the entire use interval are shown in a first graph 310. The second graph 320 shows an interval in which the internal state of the electrochemical model is not corrected by a corrector, which will be described later, and a remaining interval, excluding the interval of the second graph 320 from the first graph 310, may have the form of a graph where the estimated voltage and the measured voltage match as the internal state of the electrochemical model is corrected by the corrector. However, since the corrector only corrects the SOC value of the battery or the internal state of the electrochemical model but does not correct the aging parameter belonging to the model parameters, the difference between the estimated voltage of the battery model and the measured voltage of the actual battery may gradually increase when the corrector is temporarily turned OFF. The corrector will be described further with reference to FIG. 10.

Figure 4:
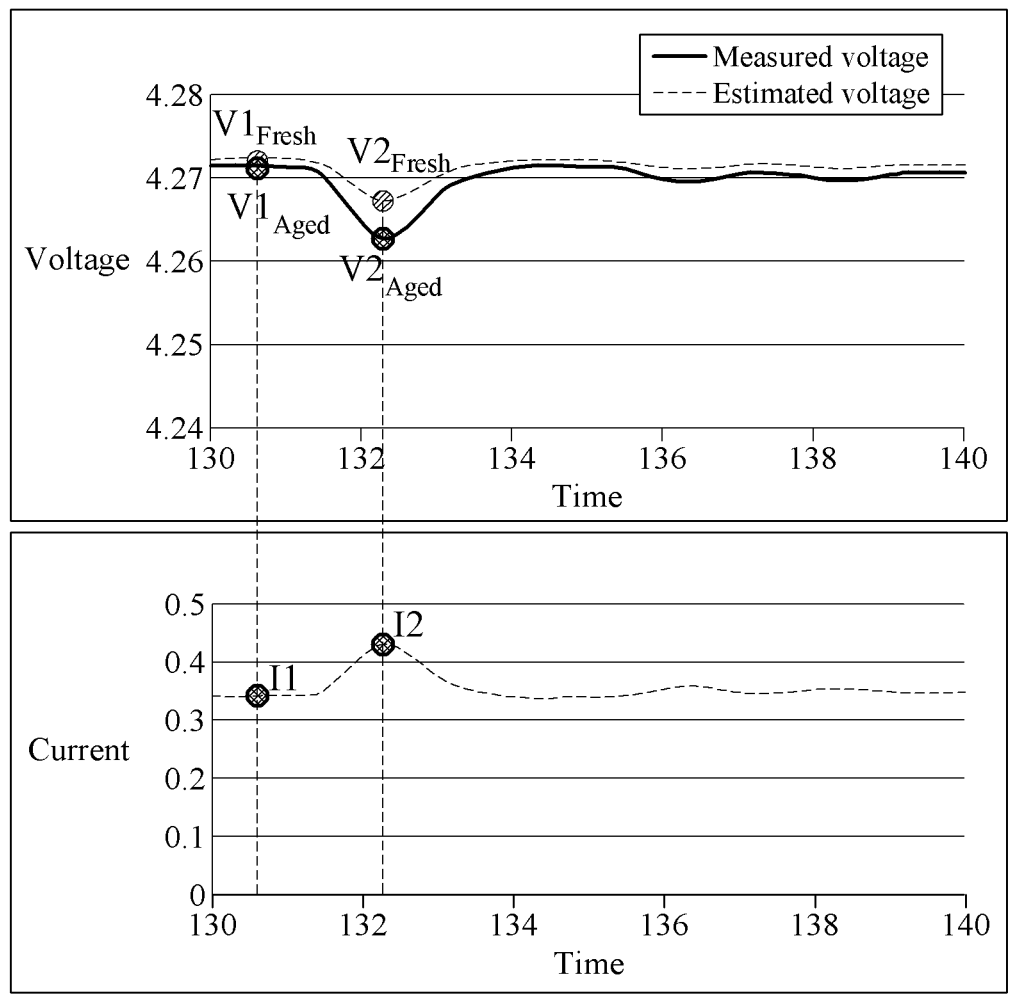
FIG. 4 illustrates an example of updating an anodic SEI resistance which is an aging parameter.

FIG. 4 illustrates an example of updating an anodic SEI resistance which is an aging parameter.

A graph of FIG. 4 exemplarily shows an estimated voltage and a measured voltage that change according to a change in the current of a battery. The graph of FIG. 4 shows the voltage changes in a relatively short time interval, compared to the first graph 310 of FIG. 3. For example, when an electronic device with a battery performs a task requiring large power or the electronic device in a sleep mode is woken, current of the battery may suddenly increase. In addition, various factors may cause a change in the current as shown in FIG. 4 due to various causes.

An anodic SEI resistance may be a resistance generated as SEI layers are piled up on the anode surface due to anode side reactions. The anodic SEI resistance may gradually increase as the aging is getting severe. The anodic SEI resistance may be updated based on a response characteristic difference between the estimated voltage and the measured voltage while the corrector is in an OFF state. A battery state estimation apparatus may determine a resistance increase based on a variation in the estimated voltage, a variation in the measured voltage, and a current variation, which may be expressed by Equation 1.

$$dV_{Fresh} = V1_{Fresh} - V2_{Fresh}$$

$$dV_{Aged} = V1_{Aged} - V2_{Aged}$$

$$d(dV) = dV_{Aged} - dV_{Fresh}$$

$$= (V1_{Aged} - V2_{Aged}) -$$

$$(V1_{Fresh} - V2_{Fresh})$$

$$dI = I2 - I1$$

$$d\Omega = \frac{d(dV)}{dI}$$

Equation 1

In Equation 1, $dV_{Fresh}$ denotes the variation in the estimated voltage of the battery estimated by the electrochemical model and may be calculated with respect to two points between which the current change is greater than or equal to a predetermined threshold. Here, the electrochemical model may be an initial electrochemical model reflecting a fresh state of the battery that is not aged yet or an electrochemical model reflecting a previous aged state. $dV_{Aged}$ denotes the variation in the measured voltage of the actual battery. dI denotes the current variation and may be determined to be $F \times \Delta j_n$. F denotes a Faraday constant, and $\Delta j_n$ denotes a variation in a current density. $d\Omega$ denotes the resistance increase, and a variation $d_{R_{sei}}$ in the anodic SEI resistance may be determined using the resistance increase as expressed by Equation 2.

$$d_{R_{sei}} = d\Omega * an * \ln * \text{area}$$

$$an = \frac{3 * eps_{a,s}}{r_a}$$

Equation 2

In Equation 2, an denotes a specific surface area of an anode active material, $eps_{a,s}$ denotes a volume fraction of the anode active material, and $r_a$ denotes a radius of the anode active material. ln denotes a thickness of an anode, and area denotes an area of the anode.

The battery state estimation apparatus may determine a variation in the anodic SEI resistance to be the aging variation, and update the anodic SEI resistance, which is one of the aging parameters, using the determined variation in the anodic SEI resistance. In some examples, the determined variation in the anodic SEI resistance may not be reflected immediately in the aging parameter but stored in a memory. If an update condition is reached, the aging parameter of the electrochemical model may be updated based on values (for example, average values, moving average values. etc.) having been stored in the memory. This will be described in detail with reference to FIG. 14.

FIGS. 5 to 9 illustrate an example of updating a capacity for cathode active material which is an aging parameter.

Figure 5:
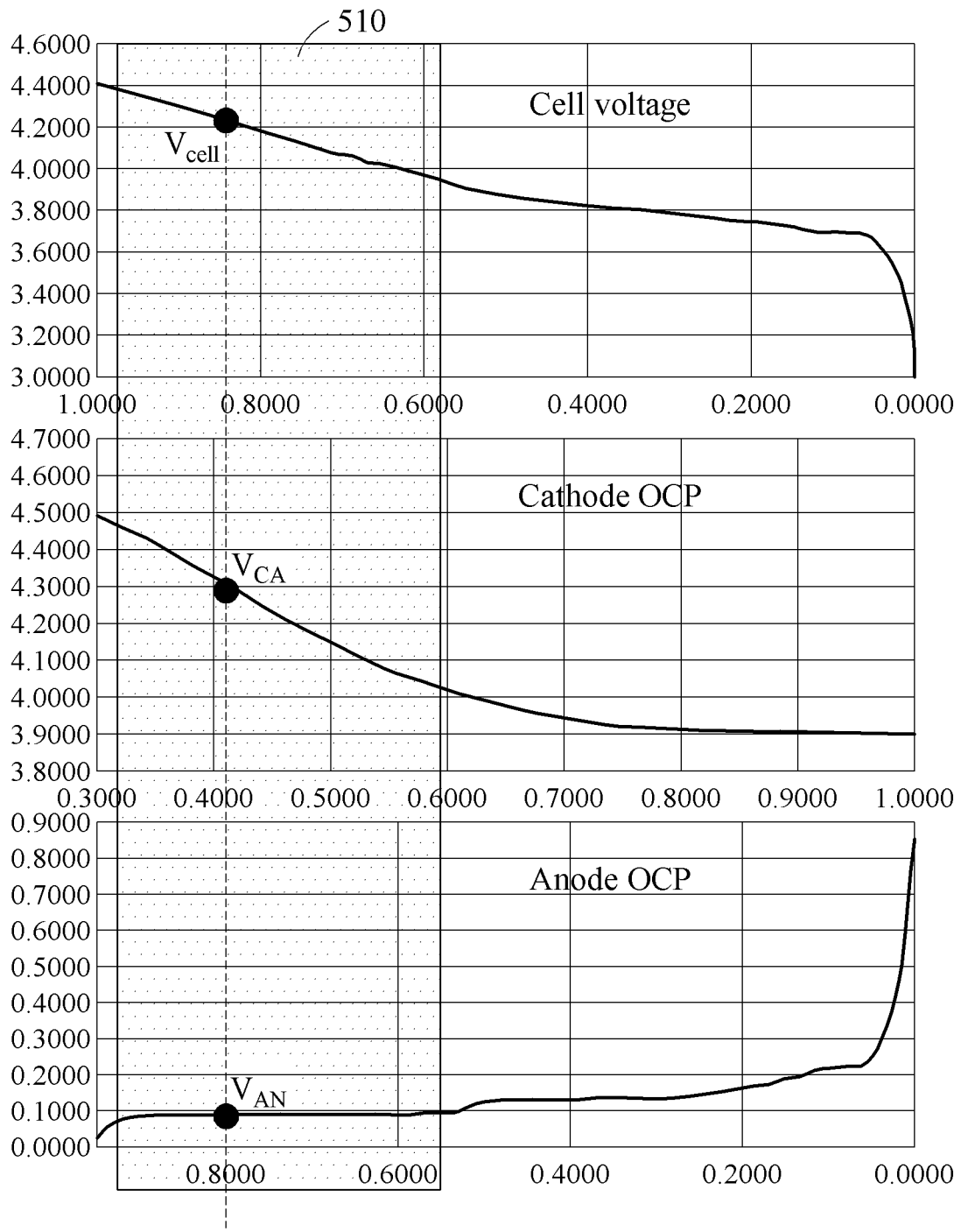
FIGS. 5, 6, 7, 8, and 9 illustrate an example of updating a capacity for cathode active material which is an aging parameter.

Referring to FIG. 5, a cell voltage, a cathode OCP, and an anode OCP measured as a battery is discharged are illustrated.

The cell voltage is a measured voltage of the battery and may be determined to be VCA-VAN and gradually decreases as the battery is used and discharged. The cathode OCP may decrease relatively constantly, compared to the anode OCP, and a slope of decrease may become gradually gentle, whereas the anode OCP may have a relatively gentle slope, compared to the cathode OCP, in the early state, but have a steep slope last. In particular, the anode OCP may have a slope of "0" degrees or a slope close to "0" degrees in the early stage. A decrease in the capacity for cathode active material, which will be described below, may be determined within an interval 510 in which the slope of the anode OCP is "0" degrees or close to "0" degrees. The interval 510 may correspond to an interval in which the SOC of the battery is large. In other words, the interval 510 in which a decrease in the capacity for cathode active material is estimated is an interval in which the state information (for example, the SOC) of the battery is greater than a predetermined threshold or falls within a predetermined range. Within the interval 510, the corrector may be controlled to be in an OFF state. Further, since the state information of the battery has a predetermined correlation with the ion concentration and the capacity for active material of the battery, the interval 510 may be detected based on one of the ion concentration and the capacity for active material of the battery in addition to the state information of the battery.

The capacity for cathode active material is an indication that quantifies a phenomenon that an active material capable of receiving lithium ions at the cathode decreases in response to aging. The more severe aging, the greater the decrease in the capacity for cathode active material. The capacity for cathode active material may be updated based on a response characteristic difference between the estimated voltage and the measured voltage while the corrector is in the OFF state. The battery state estimation apparatus may determine the capacity for cathode active material using a ratio between a response characteristic of the estimated voltage and a response characteristic of the measured voltage according to the discharging of the battery, which may be expressed by Equation 3.

$$CA_{capacity\_aged} = CA_{capacity} \times CA_{ratio} \quad \text{Equation 3:}$$

In Equation 3, $CA_{capacity}$ denotes the capacity for cathode active material reflected in the initial electrochemical model or the electrochemical model reflecting the previous aged state, and $CA_{ratio}$ denotes a change rate of the capacity for cathode active material determined to be the ratio between the response characteristics and may be determined based on an aging degree of the battery as described below and thus, may correspond to the aging variation. $CA_{capacity\_aged}$ denotes the capacity for cathode active material reflected in the electrochemical model as an aging parameter.

The battery state estimation apparatus may update the aging parameter corresponding to the capacity for cathode active material by reflecting in the electrochemical model the determined capacity for cathode active material $CA_{capacity\_aged}$. In some examples, the determined ratio between the response characteristics may not be reflected immediately in the aging parameter but stored in a memory. If an update condition is reached, the aging parameter of the electrochemical model may be updated based on values (for example, average values, moving average values. etc.) having been stored in the memory. This will be described in detail with reference to FIG. 14.

The ratio between the response characteristics may be determined based on estimated voltages and measured voltages at two points within the OFF-state interval of the corrector. For example, the ratio between the response characteristics may be a ratio between a slope determined from estimated voltages and a slope determined from measured voltages at two points within a use interval of the battery, or a ratio between an area determined from estimated voltages and an area determined from measured voltages between two points within a use interval of the battery. The two points within the use interval may be a start point and an end point of the OFF-state interval of the corrector, or two points in a monotonically decreasing interval within the OFF-state interval. Thus, it may need to prevent such an overflow, which will be described in detail hereinafter with reference to FIGS. 6 through 9.

Figure 6:
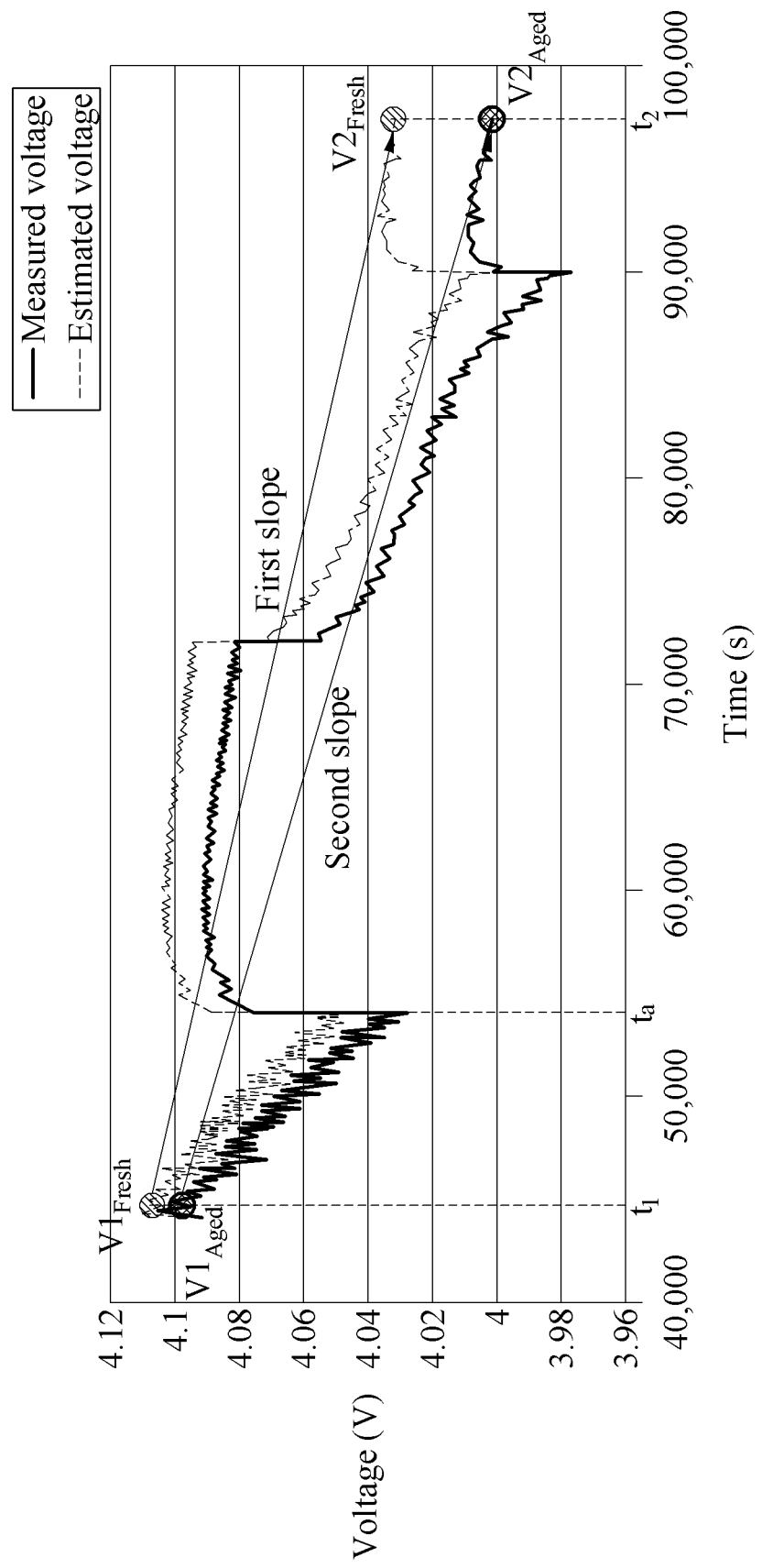

Referring to FIG. 6, the ratio between the response characteristics may be determined to be a ratio between a first slope and a second slope, wherein the first slope may be determined from estimated voltages $V1_{Fresh}$ and $V2_{Fresh}$ at a start point $t_1$ and an end point $t_2$ of the OFF-state interval of the corrector, and the second slope may be determined from measured voltages $V1_{Aged}$ and $V2_{Aged}$ at the start point $t_1$ and an end point $t_2$. In some examples, when the current of the battery decreases due to a change of a task performed by an electronic device at a predetermined point in time $t_a$, the voltage of the battery may suddenly increase. However, the ratio between the response characteristics may be determined based on only the ratio between the first slope and the second slope. The difference between the estimated voltage and the measured voltage may gradually increase over time due to the OFF state of the corrector, and such a characteristic difference may be expressed as the ratio between the first slope and the second slope. The ratio between the response characteristics may be expressed by Equation 4.

$$CA_{ratio} = \frac{\text{Estimated voltage difference}}{\text{Measured voltage difference}} \quad \text{Equation 4}$$
$$= \frac{V1_{Fresh} - V2_{Fresh}}{V1_{Aged} - V2_{Aged}}$$

Figure 7:
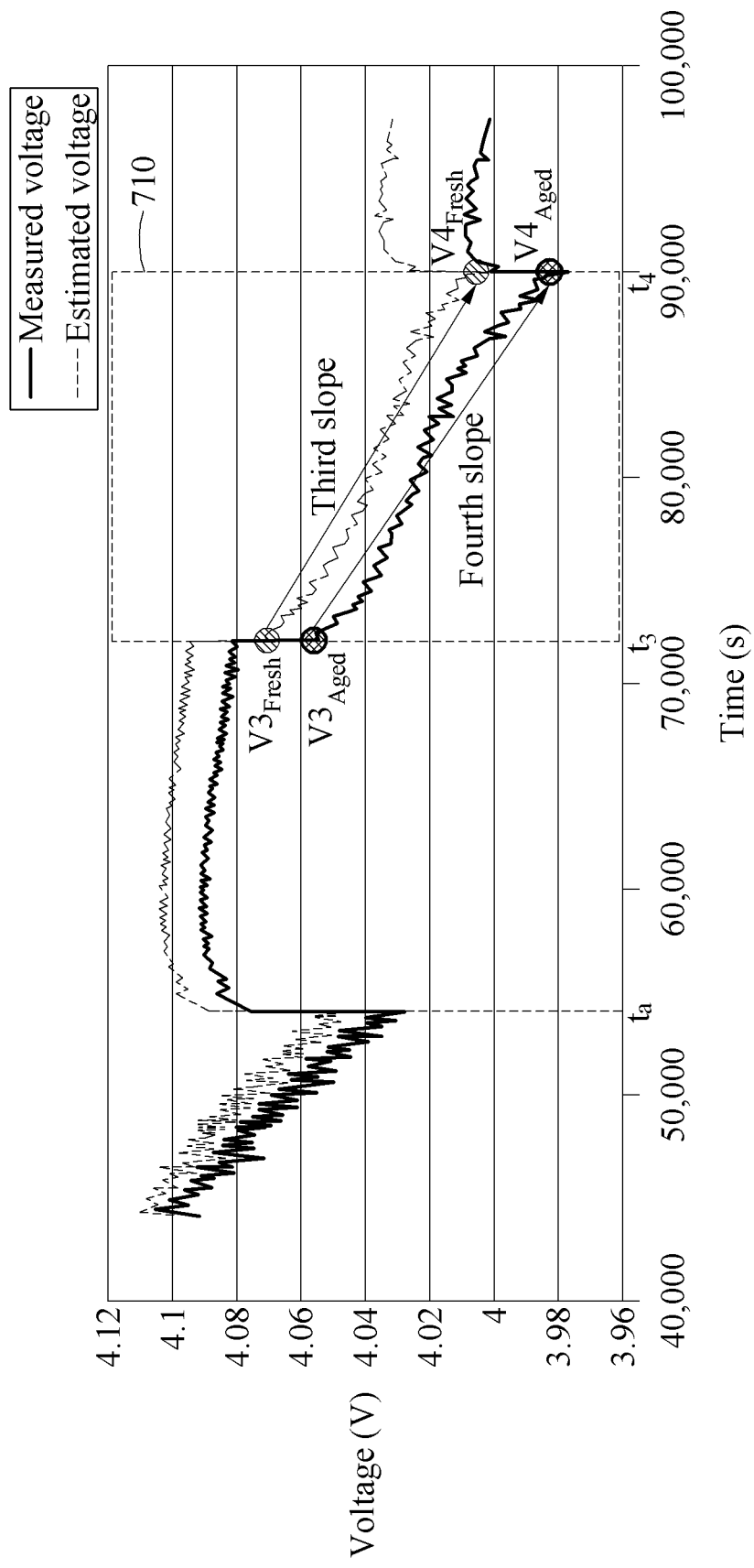

Unlike the example of FIG. 6, FIG. 7 shows an example in which two points $t_3$ and $t_4$ that determine the ratio between the response characteristics correspond to a monotonically decreasing interval 710 in which the current change of the battery is less than or equal to a predetermined threshold within the OFF-state interval of the corrector. If the task performed by the electronic device is changed in the state in which the corrector is turned OFF, the measured voltage and the estimated voltage of the battery may drastically change. For example, if the electronic device performs a predetermined task and then switches to a sleep mode as the task is terminated or if the electronic device performs a heavy task and then performs a light task, the current of the battery may decrease, and the measured voltage and the estimated voltage of the battery may rise. To prevent the rise of the measured voltage and the estimated voltage of the battery caused by the current change of the battery on the response characteristics, a monotonically decreasing interval 710 may be identified within the Off-state interval of the corrector, and two points $t_3$ and $t_4$ in the monotonically decreasing interval may be used to determine the ratio between the response characteristics. The monotonically decreasing interval 710 may be an interval in which the current change of the battery is less than or equal to a predetermined threshold, that is, an interval in which a current change is not caused by a change of the task. The ratio between the response characteristics may be determined based on a ratio between a third slope and a fourth slope, wherein the third slope may be determined from estimated voltages $V3_{Fresh}$ and $V4_{Fresh}$ at the two points $t_3$ and $t_4$ corresponding to a start point and an end point of the monotonically decreasing interval 710, and the fourth slope may be determined from measured voltages V3$_{Aged}$ and V4$_{Aged}$ at the two points t$_3$ and t$_4$.

Figure 8:
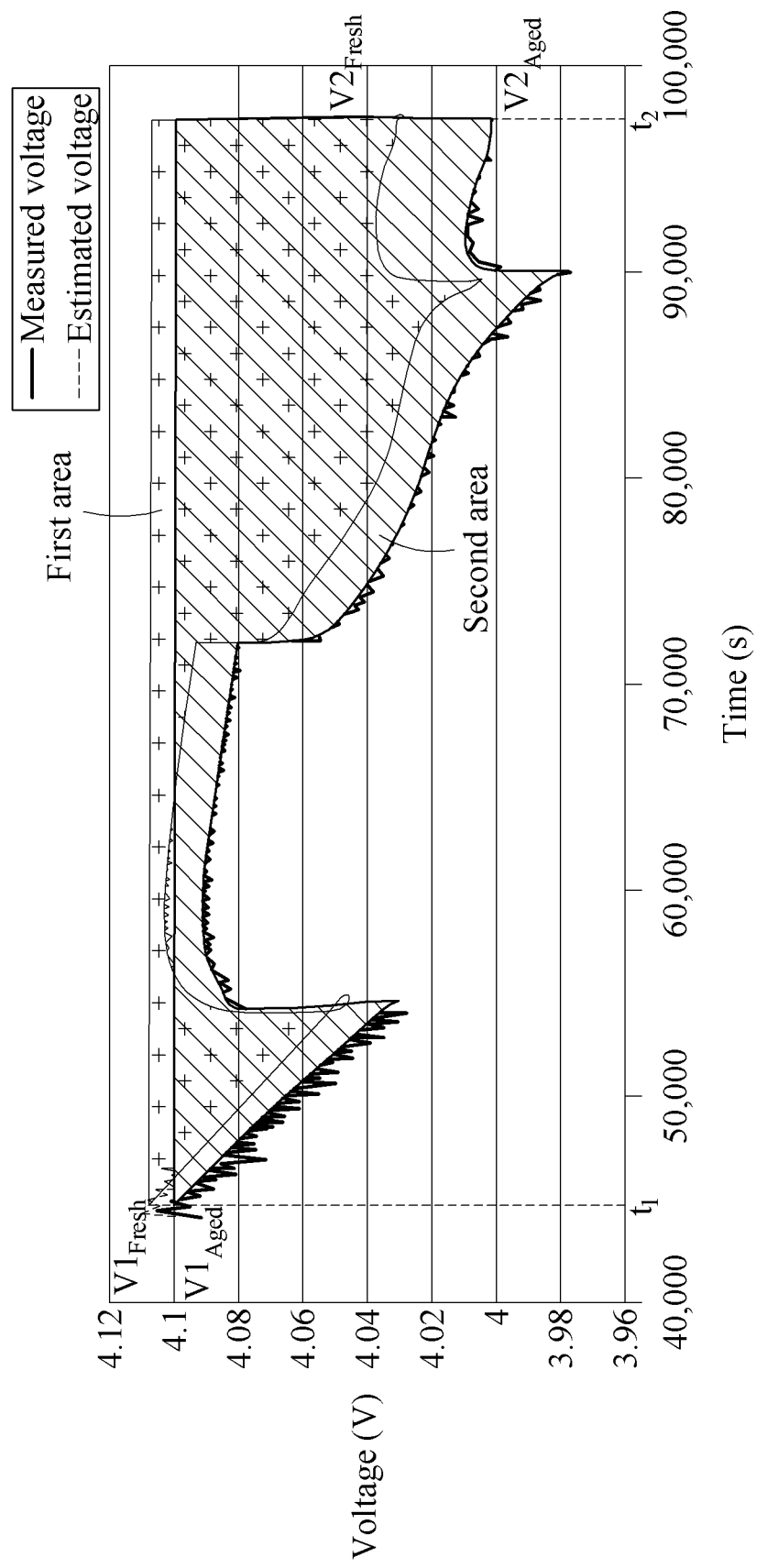

Unlike the examples of FIGS. 6 and 7, FIG. 8 shows an example in which the ratio between the response characteristics is determined to be a ratio between a first area and a second area, wherein the first area may be determined from estimated voltages between the start point t$_1$ and the end point t$_2$ of the OFF-state interval of the corrector, and the second area may be determined from measured voltages between the start point t$_1$ and the end point t$_2$. The first area may be determined using voltages, from the first estimated voltage V1$_{Fresh}$ to the last estimated voltage V2$_{Fresh}$, within the OFF-state interval. Similarly, the second area may be determined using voltages, from the first measured voltage V1$_{Aged}$ to the last measured voltage V2$_{Aged}$, within the OFF-state interval. The difference between the estimated voltage and the measured voltage may gradually increase over time due to the OFF state of the corrector, and such a characteristic difference may be expressed as the ratio between the first area and the second area. The ratio between the response characteristics may be expressed by Equation 5.

$$CA_{ratio} = \frac{\text{Estimated voltage area}}{\text{Measured voltage area}} \qquad \text{Equation 5}$$

Figure 9:
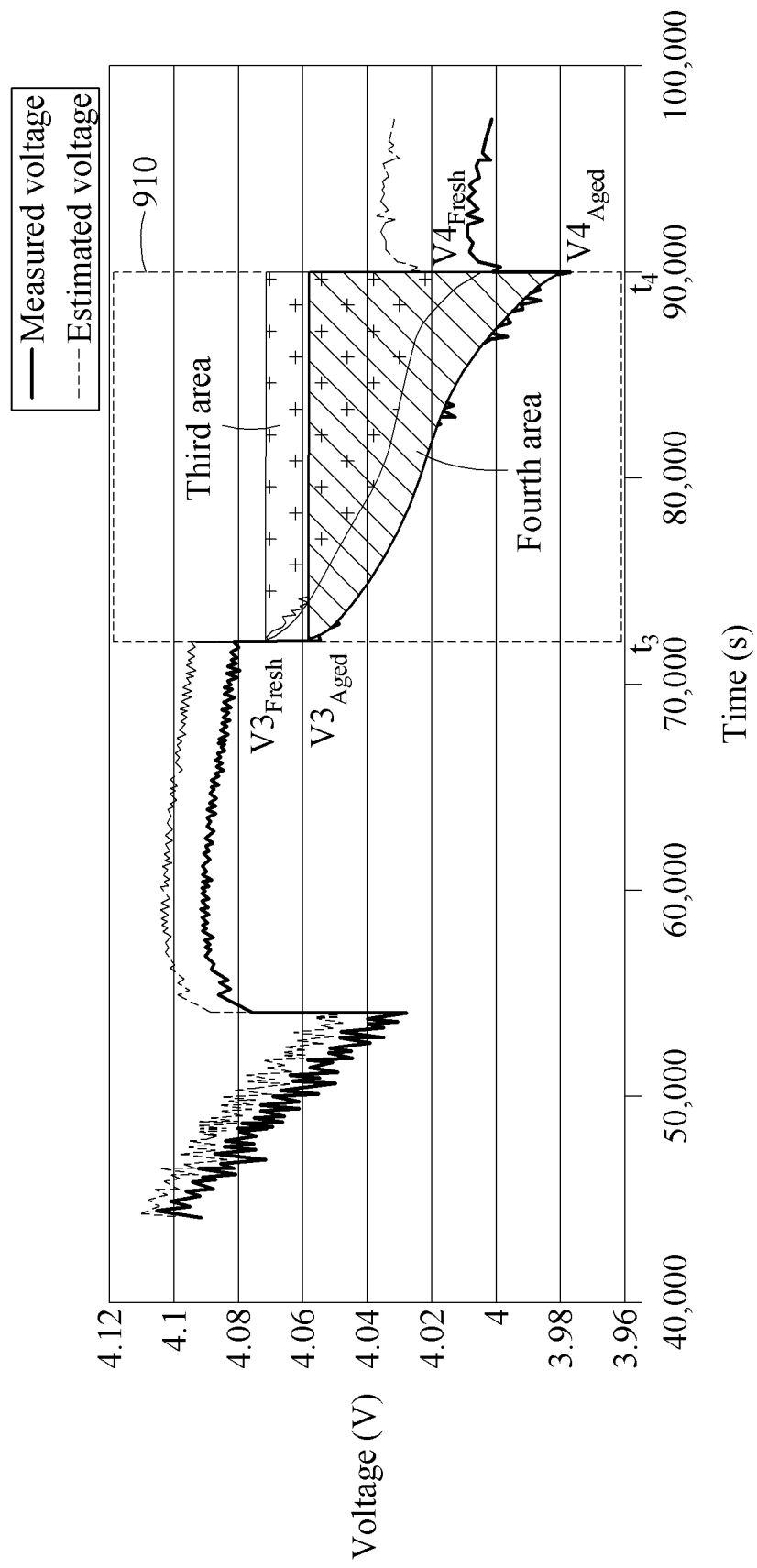

Unlike the example of FIG. 8, FIG. 9 shows an example in which two points t$_3$ and t$_4$ that determine the ratio between the response characteristics correspond to a monotonically decreasing interval 910 in which the current change of the battery is less than or equal to a predetermined threshold within the OFF-state interval of the corrector. The ratio between the response characteristics may be determined based on a ratio between a third area and a fourth area, wherein the third area may be determined from estimated voltages between the two points t$_3$ and t$_4$ corresponding to a start point and an end point of the monotonically decreasing interval 910, and the fourth area may be determined from measured voltages between the two points t$_3$ and t$_4$. The third area may be determined using voltages, from the first estimated voltage V3$_{Fresh}$ to the last estimated voltage V4$_{Fresh}$, within the monotonically decreasing interval 910. Similarly, the fourth area may be determined using voltages, from the first measured voltage V3$_{Aged}$ to the last measured voltage V4$_{Aged}$, within the monotonically decreasing interval 910.

Figure 10:
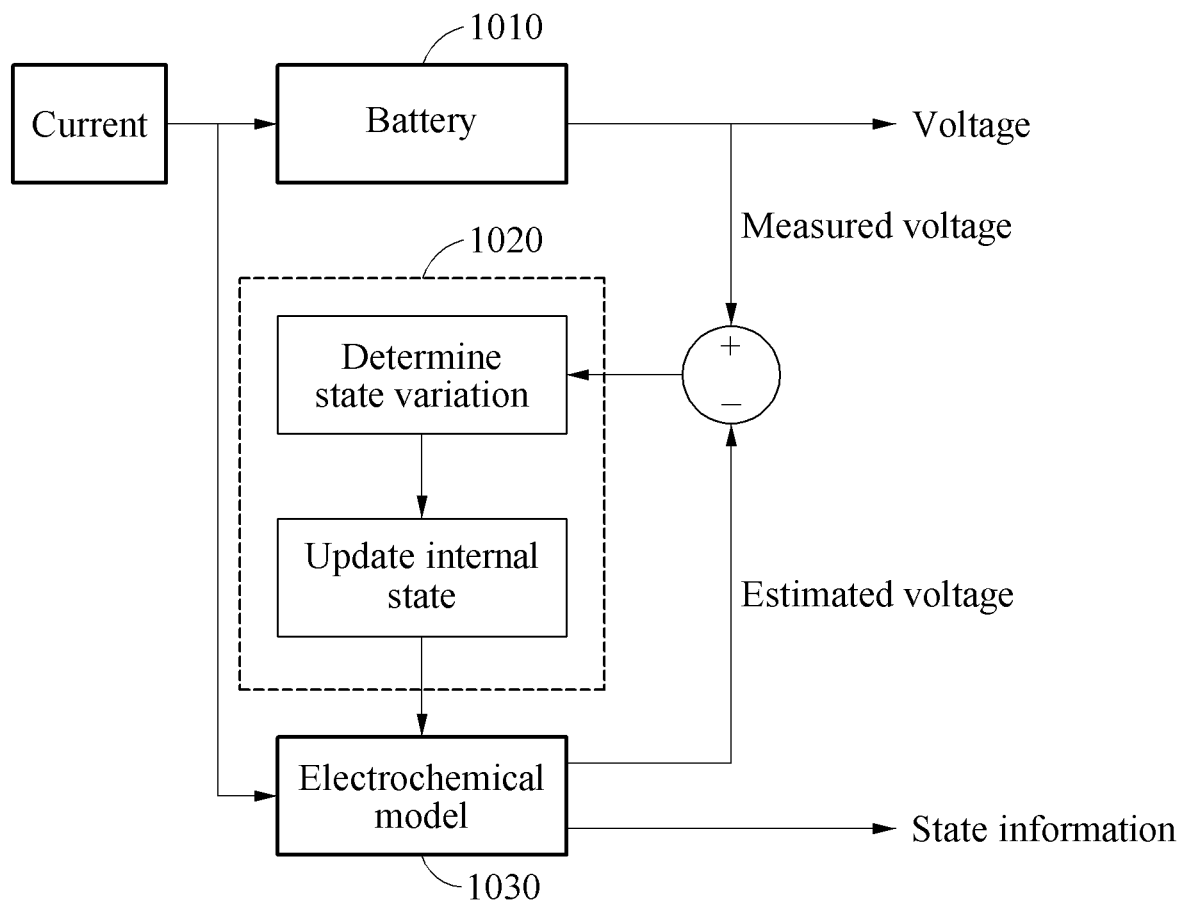
FIG. 10 illustrates an example of an operation of a corrector.

FIG. 10 illustrates an example of an operation of a corrector.

Referring to FIG. 10, a corrector 1020 may correct an internal state of an electrochemical model 1030 when an error between an estimated voltage of a battery 1010 estimated by the electrochemical model 1030 and a measured voltage of the battery 1010 occurs.

When the state information is estimated using the electrochemical model 1030, an error between sensor information obtained by measuring current, voltage, and temperature data to be input into the electrochemical model 1030 and state information calculated using a modeling scheme may occur. Thus, the corrector 1020 may correct the error.

First, a voltage difference between the measured voltage of the battery 1010 measured by a sensor and the estimated voltage of the battery 1010 estimated by the electrochemical model 1030 may be determined.

The corrector 1020 may determine a state variation of the battery 1010 using the voltage difference, previous state information previously estimated by the electrochemical model 1030, and an open circuit voltage (OCV) table. The corrector 1020 may obtain an open circuit voltage corresponding to the previous state information based on the OCV table, and determine the state variation of the battery 1010 by reflecting in the open circuit voltage the voltage difference. For example, the state variation may include a SOC variation.

The corrector 1020 may update the internal state of the electrochemical model 1030 using the state variation. For example, the internal state of the electrochemical model 1030 may include one of a voltage, an overpotential, a SOC, a cathode lithium ion concentration distribution, an anode lithium ion concentration distribution, and an electrolyte lithium ion concentration distribution of the battery 1010, or a combination of two or more thereof, and may be in the form of a profile. The corrector 1020 may update the internal state of the electrochemical model 1030 by correcting an ion concentration distribution within an active material particle or an ion concentration distribution in an electrode based on the state variation of the battery 1010.

The battery state estimation apparatus may estimate state information of the battery 1010 using the updated internal state of the electrochemical model 1030.

As described above, the battery state estimation apparatus may estimate the state information of the battery 1010 at higher accuracy, through a feedback structure that updates the internal state of the electrochemical model 1030 by determining the state variation of the battery 1010 such that the voltage difference between the measured voltage of the battery 1010 and the estimated voltage of the battery 1010 estimated by the electrochemical model 1030 is minimized.

The operation of the corrector 1020 described above may be used to update the electrode balance shift, which will be described in detail with reference to FIGS. 11 and 12.

Figure 11:
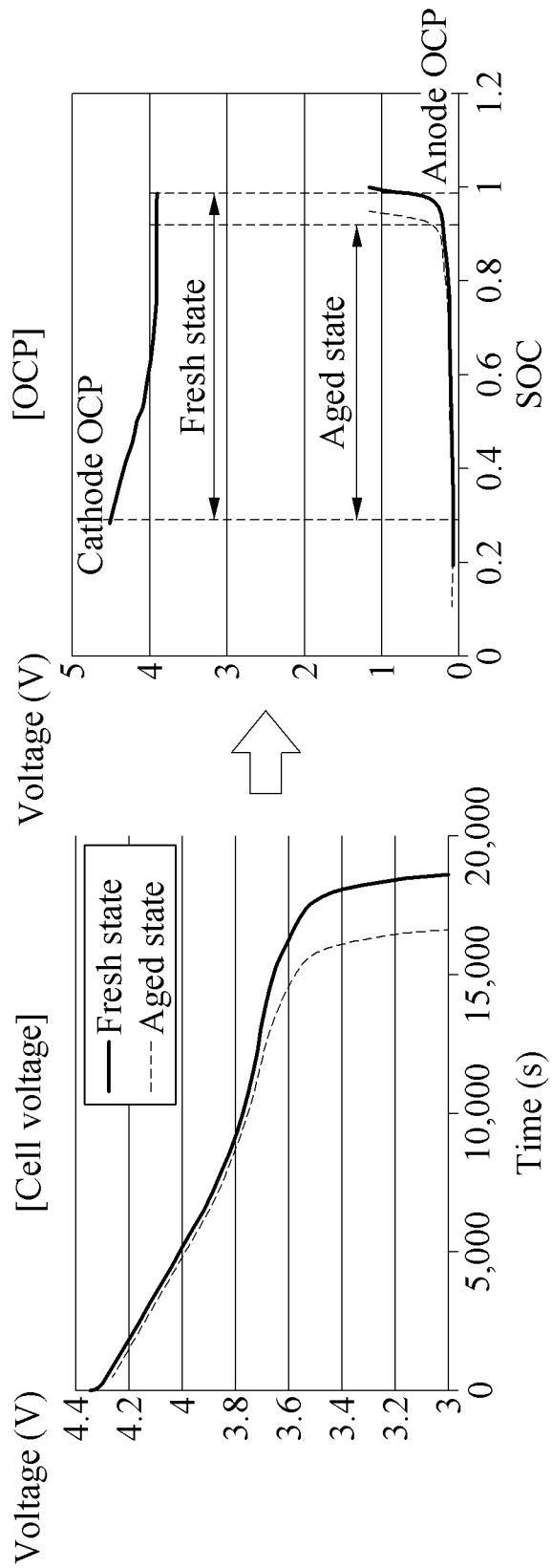
FIGS. 11 and 12 illustrate an example of updating an electrode balance shift which is an aging parameter.
Figure 12:
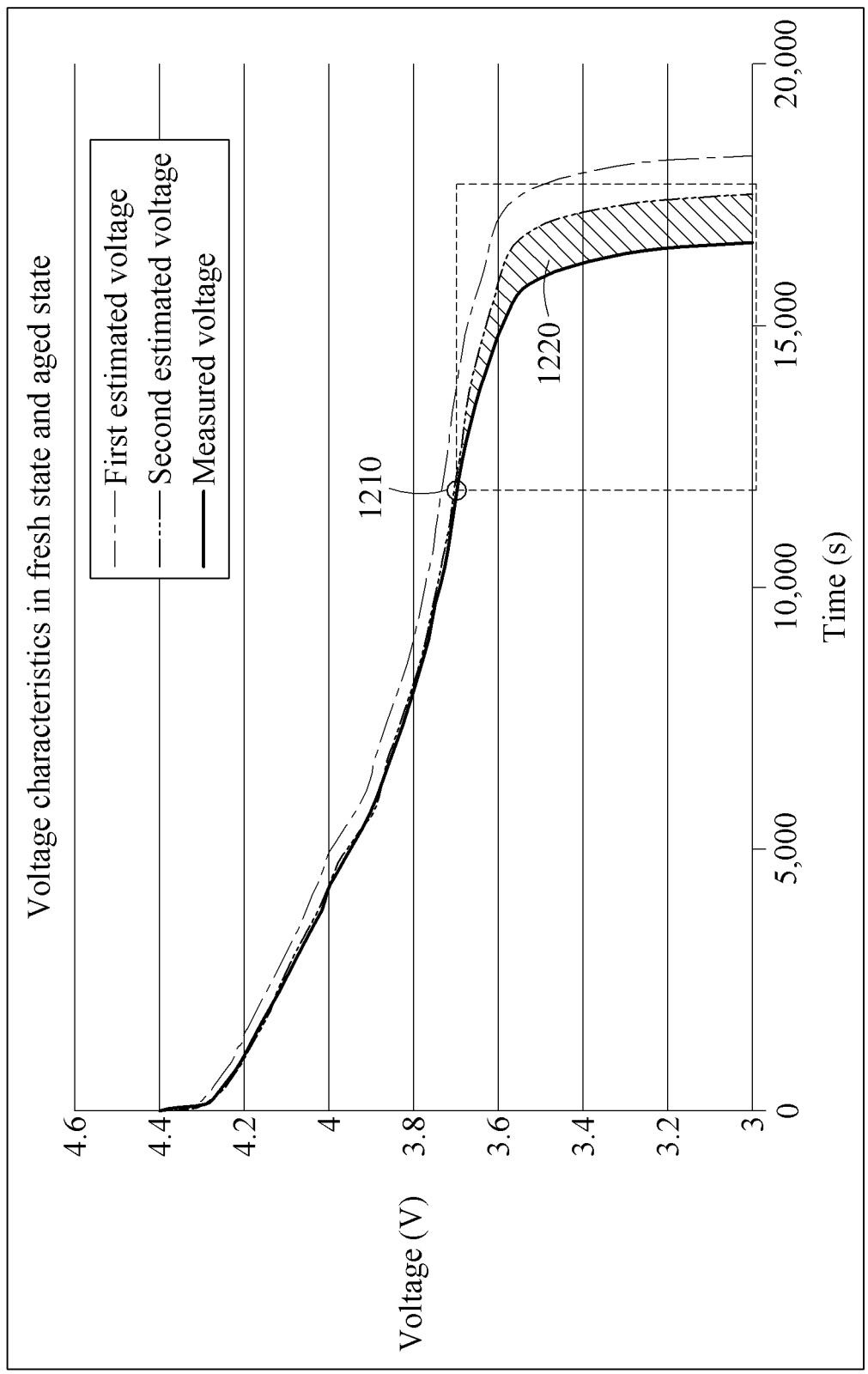

FIGS. 11 and 12 illustrate an example of updating an electrode balance shift which is an aging parameter.

FIG. 11 shows cell voltages, cathode OCPs, and anode OCPs in a fresh state in which a battery is not aged and in an aged state in which the battery is aged.

A cell voltage graph indicates a battery is used and discharged. A difference between a voltage in the fresh state and a voltage in the aged state may be larger at a low SOC at the end of discharging than at a high SOC at the beginning of discharging. In particular, at a low SOC, a drastic change in the voltage difference between the fresh state and the aged state may occur. Causes thereof may be found in an OCP graph. The cathode OCP shows a slight difference between the fresh state and the aged state, whereas the anode OCP may have a great difference between the fresh state and the aged state at a low SOC. The anode OCP in the aged state may be in a shape that is shifted leftward from the anode OCP in the fresh state, which may be referred to as an electrode balance shift.

The electrode balance shift indicates the degree of change in the balance between the cathode and the anode by a phenomenon in which lithium ions are chemically bonded to an anode by a side reaction and cannot return to a cathode. The more severe aging, the greater electrode balance shift may occur.

Referring to FIG. 12, a first estimated voltage of a battery estimated by an initial electrochemical model or an electrochemical model reflecting a previous aged state, a second estimated voltage of the battery estimated by the electrochemical model reflecting an increase in an anodic SEI resistance and a decrease in a capacity for cathode active material, and a measured voltage of the battery that is actually aged are illustrated.

A battery state estimation apparatus may use the degree in which state information (for example, SOC) of the battery is corrected by a corrector, to update an electrode balance shift which is an aging parameter. A graph of FIG. 12 may be used to obtain the degree of correction by the corrector. The first estimated voltage may be a voltage estimated by an electrochemical model reflecting neither an electrode balance shift nor an increase in the anodic SEI resistance or a decrease in the capacity for cathode active material. In this case, the corrector may also compensate for a difference caused by another aging parameter. Thus, it may be difficult to obtain only the degree of correction by the corrector for the electrode balance shift. The second estimated voltage may be a voltage estimated by an electrochemical model reflecting an increase in the anodic SEI resistance and a decrease in the capacity for cathode active material. In this case, the degree of correction by the corrector may be for the electrode balance shift. Therefore, an amount of correction of the SOC may be determined based on a degree 1220 by which the second estimated voltage is corrected to the measured voltage by the corrector. Since the SOC correction amount by the corrector is determined based on the aging degree of the battery, the SOC correction amount may correspond to the aging variation. The battery state estimation apparatus may update the aging parameter of the electrochemical model by converting the SOC correction amount by the corrector within the predetermined interval into an electrode balance shift value. The predetermined interval may be determined using a SOC which is based on an internal state of the electrochemical model, for example, a SOC of 0 to 50%. A point 1210 in FIG. 12 may be a start point for accumulating the amount of correction by the corrector to estimate the electrode balance shift value.

In some examples, the determined SOC correction amount may not be reflected immediately in the electrochemical model but stored in a memory. If an update condition is reached, the aging parameter of the electrochemical model may be updated based on values (for example, average values, moving average values. etc.) having been stored in the memory. This will be described in detail with reference to FIG. 14.

Figure 13:
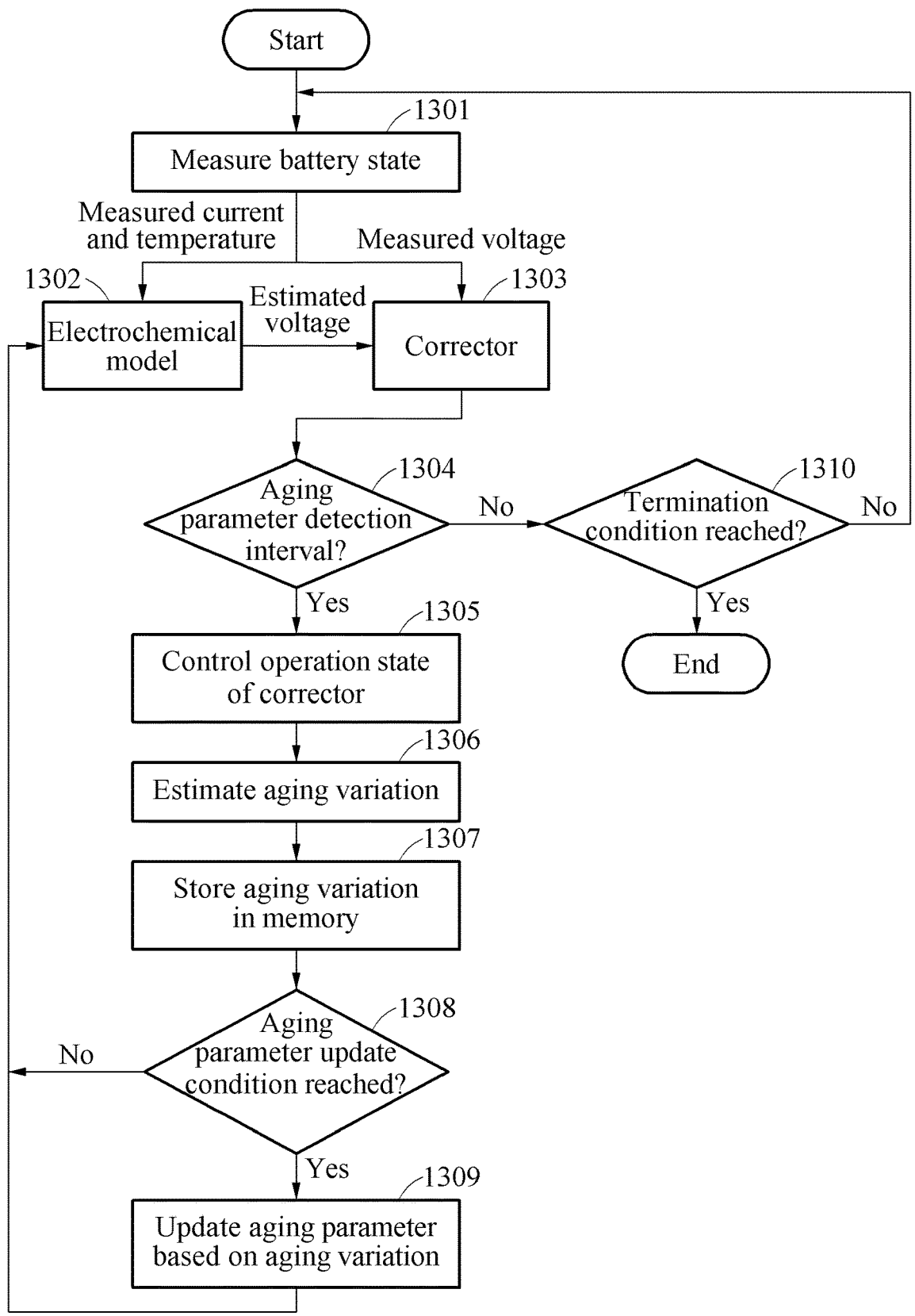
FIG. 13 illustrates an example of estimating a state of a battery.

FIG. 13 illustrates an example of estimating a state of a battery.

Referring to FIG. 13, a flowchart of the process of estimating a state of a battery by a battery state estimation apparatus is illustrated.

In operation 1301, the battery state estimation apparatus may measure a state of a battery using a sensor. For example, the battery state estimation apparatus may measure one of a voltage, a current, and a temperature of the battery, or a combination of two or more thereof. The measured data may be in the form of a profile indicating a change in size over time.

In operation 1302, the battery state estimation apparatus may determine an estimated voltage of the battery and one of state information (for example, SOC, RSOC, SOH, etc.) or a combination of two thereof through an electrochemical model. In this example, the electrochemical model may consider one of the current and the temperature measured in operation 1301 or a combination of the two.

In operation 1303, the battery state estimation apparatus may correct one of the SOC value of the battery and an internal state of the electrochemical model or a combination of the two using a difference between an estimated voltage and the measured voltage through the corrector.

In operation 1304, the battery state estimation apparatus may determine whether the current state of the battery corresponds to a detection interval for an aging parameter. For example, the battery state estimation apparatus may determine whether the current state of the battery corresponds to a detection interval for the aging parameter using the estimated SOC of the battery. Further, since the SOC of the battery has a predetermined correlation with the voltage of the battery, the battery state estimation apparatus may determine whether the current state of the battery corresponds to a detection interval for the aging parameter using the estimated voltage of the battery. Hereinafter, for ease of description, an example of determining whether it corresponds to the detection interval for the aging parameter based on the estimated SOC of the battery will be described. However, this description does not preclude an example of determining whether it corresponds to the detection interval for the aging parameter based on the estimated voltage of the battery.

The aging parameter may include one of an anodic SEI resistance, a capacity for cathode active material, and an electrode balance shift of the battery, or a combination of two or more thereof. Operations 1304 to 1309 may be performed independently for each aging parameter and will be described separately for each aging parameter.

First, a case where the aging parameter is the anodic SEI resistance will be described.

In operation 1304, the battery state estimation apparatus may determine whether the current state of the battery corresponds to a detection interval for the aging parameter using the estimated SOC of the battery. In the case of the anodic SEI resistance, the aging parameter may be estimated in various SOC ranges. However, the accuracy of the electrochemical model may be high within a high SOC interval in which the resistance value is small. Thus, the aging parameter may be estimated within a high SOC interval. Further, a corrector needs to be turned OFF to estimate the anodic SEI resistance. If the corrector is turned OFF within an interval different from an interval in which the capacity for cathode active material is estimated, a proportion occupied by the corrector OFF interval in the entire operation interval may increase. To minimize the corrector OFF interval, the anodic SEI resistance may be estimated together when the corrector is turned OFF for estimating the capacity for cathode active material. In other words, a detection interval for the anodic SEI resistance may be set to be the same as a detection interval for the capacity for cathode active material. In summary, the battery state estimation apparatus may determine whether the current state of the battery corresponds to the detection interval for the aging parameter based on whether the estimated SOC of the battery is greater than a predetermined threshold or falls within a predetermined range. Further, since the SOC of the battery has a predetermined correlation with the ion concentration and the capacity for active material of the battery, the battery state estimation apparatus may determine whether the current state of the battery corresponds to the detection interval for the aging parameter based on whether one of the ion concentration and the capacity for active material of the battery is greater than the predetermined threshold or falls within the predetermined range. For example, the detection interval may correspond to the interval 510 shown in FIG. 5.

In operation 1305, the battery state estimation apparatus may control the corrector to be in an OFF state for a predetermined time for estimating the anodic SEI resistance. When the time elapses, the battery state estimation apparatus may control the corrector to be in an ON state again.

In operation 1306, the battery state estimation apparatus may estimate an aging variation of the battery using the measured voltage and the estimated voltage. For example, the battery state estimation apparatus may determine a resistance increase based on a variation in the estimated voltage, a variation in the measured voltage, and a current variation, and determine a variation in the anodic SEI resistance to be the aging variation based on the resistance increase.

In operation 1307, the battery state estimation apparatus may store, in a memory, a variation in the anodic SEI resistance, which is the estimated aging variation, in a memory. The memory may be an internal memory of the battery state estimation apparatus or an external memory connected to the battery state estimation apparatus through a wired and/or wireless network.

In operation 1308, the battery state estimation apparatus may determine whether an update condition for the anodic SEI resistance is reached. This will be described in detail with reference to FIG. 14. If the update condition is reached, operation 1309 may be performed next. Conversely, if the update condition is not reached, operation 1302 may be performed next.

In operation 1309, the battery state estimation apparatus may update the anodic SEI resistance value, which is an aging parameter of the electrochemical model, using one or more aging variations stored in the memory. This will be described in detail with reference to FIG. 14.

A portion of or all the model parameters of the electrochemical model may mutually affect, and thus a change in one model parameter may affect another model parameter. The battery state estimation apparatus may also update model parameters of the electrochemical model, other than the anodic SEI resistance, based on the anodic SEI resistance value.

Next, a case where the aging parameter is the capacity for cathode active material will be described.

In operation 1304, the battery state estimation apparatus may determine whether the current state of the battery corresponds to the detection interval for the aging parameter based on whether the estimated SOC of the battery is greater than a predetermined threshold or falls within a predetermined range. Further, the battery state estimation apparatus may determine whether the current state of the battery corresponds to the detection interval for the aging parameter based on whether the estimated SOC of the battery is in an interval where the characteristic of the capacity for cathode active material decreasing is maximized. For example, the battery state estimation apparatus may determine whether the current state of the battery corresponds to the detection interval for the aging parameter based on whether the estimated SOC of the battery corresponds to an interval in which a change in the anode OCP of the battery is less than or equal to a predetermined first threshold and a change in the cathode OCP of the battery is greater than or equal to a predetermined second threshold. For example, as in the interval 510 of FIG. 5, when the change in the anode OCP is insignificant, but the change in the cathode OCP is significant, and the estimated SOC of the battery is greater than or equal to a predetermined level, the battery state estimation apparatus may determine that the current state of the battery corresponds to the detection interval for the aging parameter.

Whether the estimated SOC of the battery corresponds to an interval in which a change in the anode OCP of the battery is less than or equal to a predetermined first threshold and a change in the cathode OCP of the battery is greater than or equal to a predetermined second threshold may be determined by directly measuring the anode OCP and the cathode OCP. Alternatively, in some examples, it may be determined based on whether the estimated SOC of the battery corresponds to an ion concentration and/or a capacity for active material of the battery corresponding to the interval.

In operation 1305, the battery state estimation apparatus may control the corrector to be in an OFF state for a predetermined time for estimating the capacity for cathode active material. When the time elapses, the battery state estimation apparatus may control the corrector to be in an ON state again.

In operation 1306, the battery state estimation apparatus may determine, to be an aging variation, a ratio between a response characteristic of the estimated voltage and a response characteristic of the measured voltage according to one of the discharging of the battery and the current change or a combination of the two.

The description of operations 1307 to 1309 provided above may also apply to the case where the aging parameter is the capacity for cathode active material, and thus a further detailed description will be omitted.

Last, a case where the aging parameter is the electrode balance shift will be described.

In operation 1304, the battery state estimation apparatus may determine whether the current state of the battery corresponds to the detection interval for the aging parameter based on whether one of the estimated SOC, the ion concentration, and the capacity for active material of the battery is less than a predetermined threshold and/or falls within a predetermined range. Further, the battery state estimation apparatus may determine whether the current state of the battery corresponds to the detection interval for the aging parameter based on whether the current state of the battery corresponds to an interval where the characteristic of the electrode balance shift is maximized. For example, whether the current state of the battery corresponds to an interval where the characteristic of the electrode balance shift is maximized may be determined based on one of the SOC, the ion concentration, and the capacity for active material of the battery.

In operation 1305, the battery state estimation apparatus may control the corrector to be in an ON state for estimating the electrode balance shift.

In operation 1306, the battery state estimation apparatus may determine a degree in which the SOC value is corrected by the corrector to be the aging variation.

The description of operations 1307 to 1309 provided above may also apply to the case where the aging parameter is the electrode balance shift, and thus a further detailed description will be omitted.

In operation 1310, the battery state estimation apparatus may determine whether a termination condition is reached. For example, it may be determined that the termination condition is reached when a predetermined operation time elapses. If the predetermined operation time does not elapse, operation 1301 may be performed next. Conversely, if the predetermined operation time elapses, the battery state estimation operation may be terminated.

Through the operation of the battery state estimation apparatus described above, it is possible to update the aging parameters of the electrochemical model to actively track the aged state of the actual battery that is aged differently according to the use pattern or environment of the battery.

The descriptions provided with reference to FIGS. 1 to 12 may apply to the operations shown in FIG. 13, and thus a further detailed description will be omitted.

Figure 14:
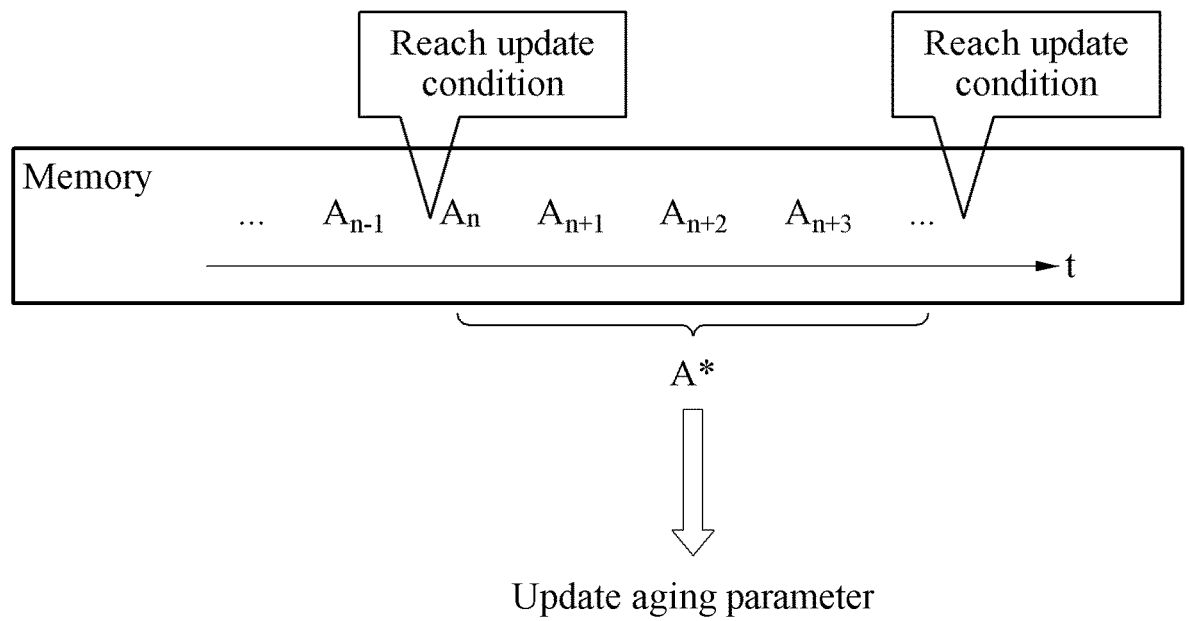
FIG. 14 illustrates an example of updating an aging parameter using one or more aging variations stored in a memory.

FIG. 14 illustrates an example of updating an aging parameter using one or more aging variations stored in a memory.

Referring to FIG. 14, an example of storing an aging variation in a memory each time the aging variation is estimated is illustrated. In FIG. 14, $A_{-1}, A_n, \ldots, A_{n+3}$ may be aging variations that are sequentially estimated. When the update condition is reached after the aging variation $A_{n+3}$ is estimated, a final aging variation A* to be used for updating aging parameters may be determined based on one or more aging variations stored in the memory. For example, the final aging variation A* may be determined to be a statistical value (for example, an average value, a moving average value, etc.) of the aging variations $A_n, \ldots, A_{n+3}$ between a current point in time at which the update condition is reached and a last point in time. Alternatively, the final aging variation A* may be determined to be a statistical value of n aging variations that have been most recently estimated based on the current point in time at which the update condition is reached (n being a natural number). Depending on a circumstance (for example, if n is "5"), the aging variation (for example, $A_{n-1}$) used in the determination of a previous aging parameter may also be used for this update.

The update condition may be determined based on one of a number of cycles of the battery, a cumulative use capacity of the battery, a cumulative use time of the battery, and a number of aging variations stored in the memory, or a combination of two or more thereof. For example, to update an aging parameter using multiple aging variations accumulated as the battery is charged and discharged a number of times, one of the number of cycles of the battery, the cumulative use capacity of the battery, the cumulative use time of the battery, and the number of aging variations stored in the memory, or a combination of two or more thereof may be used as the update condition. The update condition may be set independently for each of the anodic SEI resistance, the capacity for cathode active material, and the electrode balance shift, so that a predetermined aging parameter may be more frequently updated than the other aging parameters. However, the example of the update condition is not limited thereto.

Figure 15:
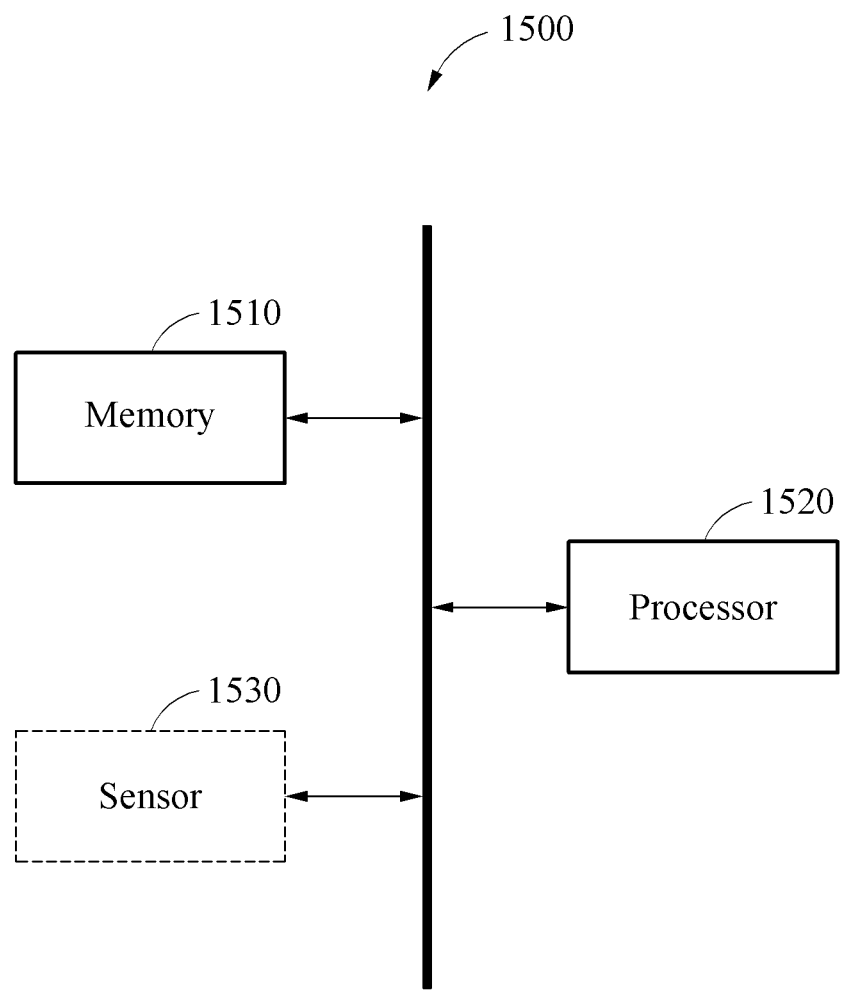
FIG. 15 illustrates an example of a battery state estimation apparatus.

FIG. 15 illustrates an example of a battery state estimation apparatus.

Referring to FIG. 15, a battery state estimation apparatus 1500 includes a memory 1510 and a processor 1520. According to an example, the battery state estimation apparatus 1500 may further include a sensor 1530. The memory 1510, the processor 1520, and the sensor 1530 may communicate with each other through a bus, peripheral component interconnect express (PCIe), or a network on a chip (NoC).

The memory 1510 may include computer-readable instructions. The processor 1520 may perform the operations described above when the instructions stored in the memory 1510 are executed by the processor 1520. The memory 1510 may include a volatile memory and a non-volatile memory. The memory 1510 stores an electrochemical model corresponding to a battery. Storing an electrochemical model may be storing relational information between model parameters of the electrochemical model and variables.

For example, the volatile memory may include a random-access memory (RAM), and may have a capacity of 2 to 8 kilobytes per unit cell. If a battery includes multiple cells, the capacity of the volatile memory may further increase according to the number of cells. For example, if the battery includes three unit cells, the capacity of the volatile memory may be 6 to 24 kilobytes.

The non-volatile memory may include a flash memory, and may store a lookup table (e.g., an OCV table) used in an electrochemical model, estimated aging variations, and compiled code that is executed by the battery state estimation apparatus 1500. For example, the capacity of the non-volatile memory may be 20 to 100 kilobytes per unit cell, and similarly, if the battery includes multiple cells, the capacity may further increase.

The sensor 1530 may measure a voltage of a battery. According to an example, the battery state estimation apparatus 1500 may additionally include a sensor for measuring a current of the battery and/or a sensor for measuring a temperature of the battery. Information measured by the sensor 1530 may be transmitted to the processor 1520. The sensor 1530 may be a part of the battery state estimation apparatus 1500, or may not. For example, the sensor 1530 may be a part of a battery, and the battery state estimation apparatus 1500 may receive and use values measured by the sensor 1530.

The processor 1520 may be a device that executes instructions or programs or controls the battery state estimation apparatus 1500, and may be, for example, a micro controller unit (MCU). The processor 1520 estimates an aging variation of the battery using a measured voltage of the battery and an estimated voltage obtained from the electrochemical model, and updates an aging parameter of the electrochemical model using the aging variation. Further, the processor 1520 may estimate state information of the battery using the electrochemical model to which the updated aging parameter is applied.

The above-described estimated aging variation may be utilized to update the aging parameter of the electrochemical model and stored in the non-volatile memory. When the battery state estimation apparatus 1500 is reset, the aging variation stored in the volatile memory may be erased, and the processor 1520 may update the aging parameter of the electrochemical model based on the aging variation stored in the non-volatile memory.

The battery state estimation apparatus 1500 may be mounted on a power management integrated circuit (PMIC) or a fuel gauge integrated circuit (FGIC) and may also reflect in the electrochemical model the aged state of the battery. The battery state estimation apparatus 1500 may estimate the aging parameter of the battery through a simple scheme of comparing voltage response characteristics according to input current by utilizing the corrector, thereby reflecting aging in the electrochemical model even at a low cost. Further, the aging parameter of the electrochemical model may be updated according to the response characteristic of the battery, and thus aging according to the use pattern or environment of the battery may be actively reflected in the electrochemical model. Further, since the aging parameter of the electrochemical model is directly updated, the battery may be charged fast while effectively avoiding aging acceleration conditions.

In addition, the battery state estimation apparatus 1500 may process the operations described above.

Figure 16:
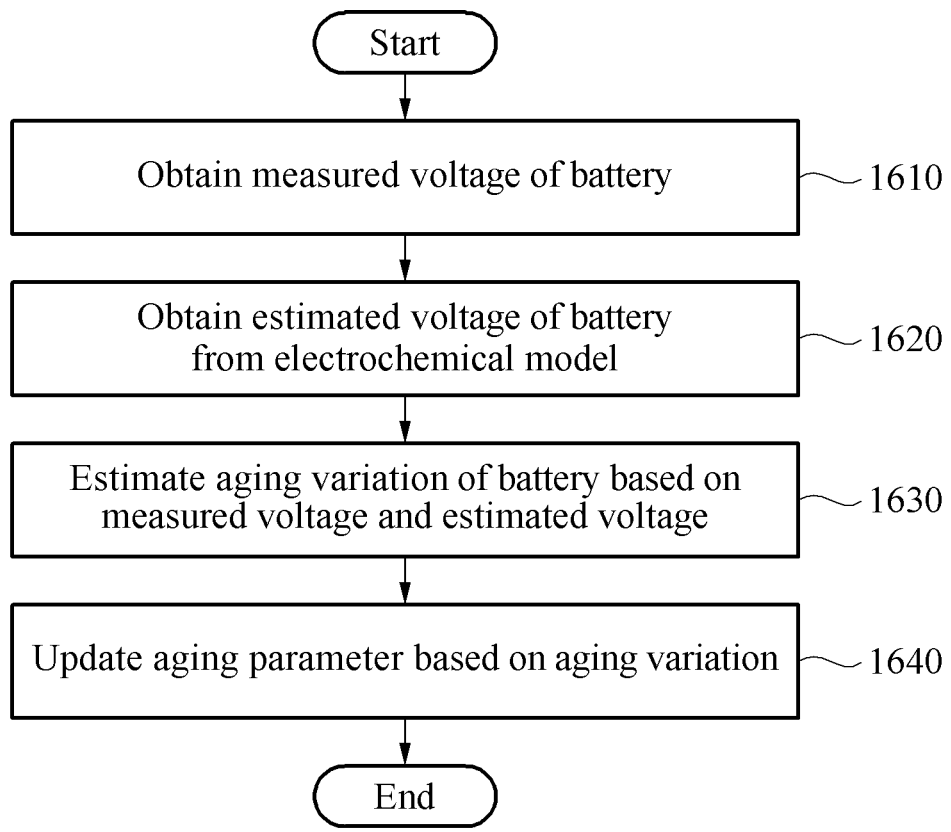
FIG. 16 illustrates an example of a battery state estimation method.

FIG. 16 illustrates an example of a battery state estimation method.

Referring to FIG. 16, a battery state estimation method performed by a processor provided in a battery state estimation apparatus is shown.

In operation 1610, the battery state estimation apparatus obtains a measured voltage of a battery from a sensor connected to the battery.

In operation 1620, the battery state estimation apparatus obtains an estimated voltage of the battery from an electrochemical model stored in a memory.

In operation 1630, the battery state estimation apparatus estimates an aging variation of the battery using the measured voltage and the estimated voltage. The battery state estimation apparatus may estimate the aging variation using a response characteristic difference between the estimated voltage of the battery and the measured voltage of the battery. For example, the battery state estimation apparatus may determine a resistance increase based on a variation in the estimated voltage, a variation in the measured voltage, and a current variation according to a current change of the battery, and determine a variation in the anodic SEI resistance to be the aging variation based on the resistance increase. The battery state estimation apparatus may determine a ratio between a response characteristic of the estimated voltage and a response characteristic of the measured voltage according to discharging of the battery to be the aging variation. In this case, a corrector for the electrochemical model may be controlled to be in an OFF state.

Further, the battery state estimation apparatus may determine a degree in which the state information is corrected by the corrector to be the aging variation, in response to the corrector being controlled to be in an ON state.

In operation 1640, the battery state estimation apparatus updates an aging parameter of the electrochemical model using the aging variation. For example, the battery state estimation apparatus may update the aging parameter using one or more aging variations stored in the memory, in response to an update condition for the aging parameter being reached. The update condition may be determined based on one of a number of cycles of the battery, a cumulative use capacity of the battery, a cumulative use time of the battery, and a number of aging variations stored in the memory, or a combination of two or more thereof.

Although not shown in FIG. 16, the battery state estimation apparatus may further estimate state information of the battery using the electrochemical model to which the updated aging parameter is applied. The aging parameter may include one of an anodic SEI resistance, a capacity for cathode active material, and an electrode balance shift of the battery, or a combination of two or more thereof.

The descriptions provided with reference to FIGS. 1 to 15 may apply to the operations shown in FIG. 16, and thus a further detailed description will be omitted.

Figure 17:
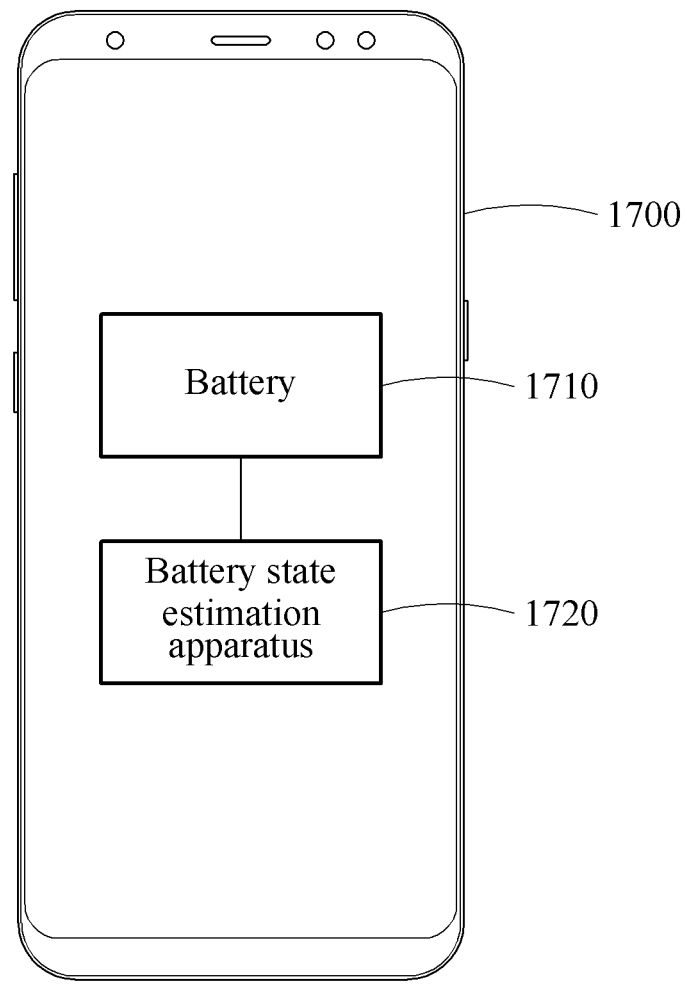
FIGS. 17 and 18 illustrates examples of a mobile device.
Figure 18:
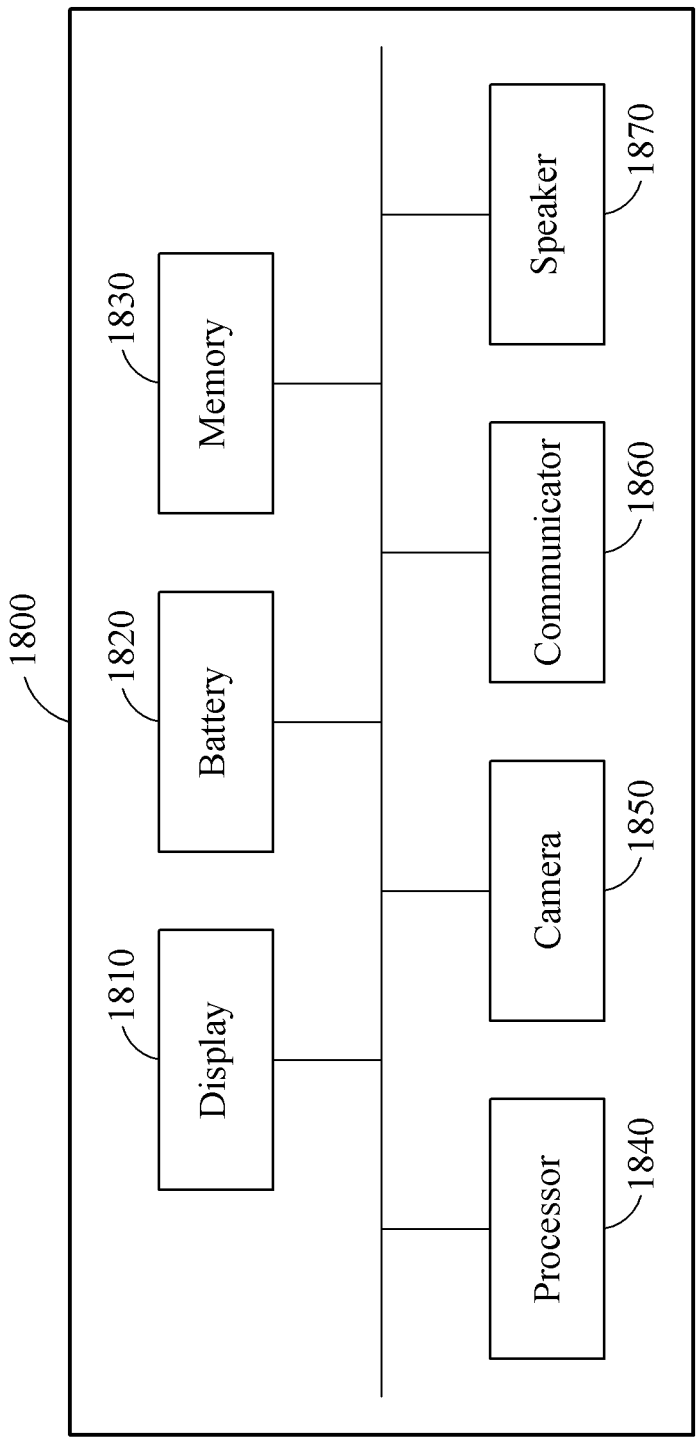

FIGS. 17 and 18 illustrate examples of mobile devices.

Referring to FIG. 17, a mobile device 1700 includes a battery 1710 and a battery state estimation apparatus 1720. The mobile device 1700 may be a device that uses the battery 1710 as a power source. For example, the battery 1710 may have a capacity per unit cell of 10 ampere hours (Ah) or less and may be a pouch-type cell, but the configuration is not limited thereto. The mobile device 1700 may be a portable terminal, for example, a smart phone. A display provided in the mobile device 1700 may display battery-related information and/or an operation screen of the mobile device 1700. Although FIG. 17 illustrates for ease of description a case in which the mobile device 1700 is a smart phone, various terminals such as a notebook computer, a tablet PC, and a wearable device may be applied thereto without limitation.

The battery state estimation apparatus 1720 may estimate state information of the battery 1710 using an electrochemical model corresponding to the battery 1710. The battery state estimation apparatus 1720 may estimate an aging variation of the battery based on a measured voltage and an estimated voltage and update an aging parameter based on the aging variation.

Referring to FIG. 18, a mobile device 1800 includes a display 1810, a battery 1820, a memory 1830, and a processor 1840. The mobile device 1800 may further include a camera 1850, a cover (not shown), a communicator 1860, and a speaker 1870.

The display 1810 may display data processed by the processor 1840 or an operation of the mobile device 1800. For example, the diagonal length of the display 1810 may be 10 centimeters (cm) to 70 cm. Furthermore, the diagonal length of the display 1810 may be 50 cm or less. Further, the display 1810 may be a touchscreen display 1810 for detecting a touch gesture that is input from a user. The touch gesture detected by the touchscreen display 1810 may be transmitted to the processor 1840 and processed.

The battery 1820 may supply power for operating the mobile device 1800. For example, the battery 1820 may supply power to the display 1810, the memory 1830, the processor 1840, the camera 1850, the cover, the communicator 1860, and the speaker 1870. The battery 1820 may have a capacity per unit cell of 10 Ah or less.

The memory 1830 may store an electrochemical model for the battery 1820 and may include a volatile memory and a non-volatile memory. For example, the capacity of the volatile memory may be 2 to 8 kilobytes per unit cell and may increase according to the number of unit cells included in the battery 1820. The capacity of the non-volatile memory may be 20 to 100 kilobytes per unit cell and, likewise, may increase according to the number of unit cells included in the battery 1820.

The processor 1840 may estimate a voltage of the battery 1820 using the electrochemical model. Further, the processor 1840 may control the overall operation of the mobile device 1800. For example, the processor 1840 may display the estimated voltage of the battery 1820 on the display 1810. The processor 1840 may be a MCU.

The mobile device 1800 may further include a PMIC. The memory 1830 and the processor 1840 may be included in the PMIC. However, examples are not limited thereto, and in another example, the memory 1830 and the processor 1840 may not be included in the PMIC.

The camera 1850 may be disposed to capture a user looking at the display 1810. For example, the camera 1850 may be disposed on the same side as the display 1810 in the mobile device 1800, but examples are not limited thereto. The camera 1850 may capture photos and/or videos in various directions in the mobile device 1800. According to an example, the mobile device 1800 may include a plurality of cameras 1850.

The cover may cover a portion of the mobile device 1800, other than the display 1810. The battery 1820, the memory 1830, the processor 1840, and the communicator 1860 may be disposed between the cover and the display 1810.

The communicator 1860 may communicate with an external device. The communicator 1860 may transmit data received from the external device to the processor 1840, or transmit data processed by the processor 1840 to the external device.

The speaker 1870 may be disposed to output a sound according to an operation of the mobile device 1800. For example, the speaker 1870 may be disposed on the same side as the display 1810 to output a sound to the user looking at the display 1810, but examples are not limited thereto. The speaker 1870 may be disposed in various directions in the mobile device 1800 to output sounds.

The description provided with reference to FIGS. 1 through 16 also applies to the description of FIGS. 17 and 18, and thus a detailed description will be omitted for conciseness.

The battery estimation apparatus and other devices, apparatuses, units, modules, and components described herein with respect to FIGS. 1, 2, 10, 15, 17, and 18 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 2-9, 11-14, and 16, for example, that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

A number of examples have been described above. Nevertheless, it should be understood that various modifications may be made to these examples. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A processor-implemented method of estimating a state of a battery, the method comprising:
   obtaining a measured voltage of a battery from a sensor connected to the battery;
   obtaining an estimated voltage of the battery from an electrochemical model stored in a memory;
   selectively applying a correction with respect to the electrochemical model between ON and OFF states respectively corresponding to performance and non-performance of the applying of the correction;
   estimating an aging variation of the battery based on the measured voltage and the estimated voltage; and
   updating an aging parameter of the electrochemical model using the estimated aging variation,
   wherein the estimating of the age variation is performed during the OFF state.

2. The method of claim 1, wherein the estimating of the aging variation comprises estimating the aging variation based on a response characteristic difference between the estimated voltage of the battery and the measured voltage of the battery.

3. The method of claim 2, wherein the estimating of the aging variation comprises determining a resistance increase based on a variation in the estimated voltage, a variation in the measured voltage, and a current variation of the battery, and determining a variation in an anodic solid electrolyte interphase (SEI) resistance to be the aging variation based on the resistance increase.

4. The method of claim 2, wherein the estimating of the aging variation comprises determining a ratio between a response characteristic of the estimated voltage and a response characteristic of the measured voltage according to discharging of the battery to be the aging variation.

5. The method of claim 4, wherein the ratio between the response characteristic of the estimated voltage and the response characteristic of the measured voltage comprises one of:
   a ratio between a slope determined from estimated voltages and a slope determined from measured voltages at two points within a use interval of the battery; and
   a ratio between an area determined from estimated voltages and an area determined from measured voltages between two points within a use interval of the battery.

6. The method of claim 5, wherein the two points within the use interval of the battery correspond to a start point and an end point of an OFF-state interval corresponding to the OFF state, or belong to another interval in which a current change of the battery is less than or equal to a first threshold within the OFF-state interval.

7. The method of claim 1, wherein the operation state is controlled to change dependent on state information of the battery estimated by the electrochemical model.

8. The method of claim 7, further comprising controlling the operation state to be the OFF state in response to any one of the state information of the battery, an ion concentration of the battery, and a capacity for active material of the battery being greater than a second threshold or falling within a first range.

9. The method of claim 7, further comprising controlling the operation state to be the OFF state, when any one of the state information of the battery, an ion concentration of the battery, and a capacity for active material of the battery corresponds to an interval in which a change in an anode open circuit potential (OCP) of the battery is less than or equal to a third threshold and a change in a cathode OCP of the battery is greater than or equal to a fourth threshold.

10. The method of claim 7, wherein the estimating of the aging variation comprises determining a degree in which the state information of the battery is corrected by the applying of the correction to be the aging variation, in response to the operation state being controlled to be the ON state.

11. The method of claim 7, further comprising controlling the operation state to be the ON state in response to any one of the state information of the battery, an ion concentration of the battery, and a capacity for active material of the battery being less than a fifth threshold or falling within a second range.

12. The method of claim 7, further comprising controlling the operation state to be the ON state, when any one of the state information of the battery, an ion concentration of the battery, and a capacity for active material of the battery corresponds to an interval in which a change in an anode OCP of the battery is greater than or equal to a sixth threshold.

13. The method of claim 1, further comprising:
   storing the aging variation in the memory; and
   updating the aging parameter using one or more aging variations stored in the memory, in response to an update condition for the aging parameter being reached.

14. The method of claim 13, wherein whether the update condition has been reached is determined based on one or more of a number of cycles of the battery, a cumulative use capacity of the battery, a cumulative use time of the battery, and a number of aging variations stored in the memory.

15. The method of claim 1, wherein the aging parameter comprises one or more of an anodic solid electrolyte interphase (SEI) resistance, a capacity for cathode active material, and an electrode balance shift of the battery.

16. The method of claim 7, further comprising:
   estimating the state information of the battery using the electrochemical model to which the updated aging parameter is applied.

17. A non-transitory computer-readable storage medium storing instructions that, when executed by a processor, cause the processor to perform the method of claim 1.

18. An apparatus for estimating a state of a battery, the apparatus comprising:
a memory configured to store an electrochemical model;
a sensor configured to measure a voltage of the battery; and
a processor configured to:
estimate: in OFF state, an aging variation of the battery based on a measured voltage of the battery and an estimated voltage obtained from the electrochemical model;
selectively apply a correction with respect to the electrochemical model, where an operation state of the selective application includes an ON state and the OFF state respectively corresponding to performance and non-performance of the application of the correction; and
update an aging parameter of the electrochemical model using the estimated aging variation.

19. A mobile device, comprising:
a display;
a battery configured to supply power to the display;
a memory configured to store an electrochemical model for the battery; and
a processor configured to:
estimate a voltage of the battery using the electrochemical model; and
control a selective setting of an operation state, between ON and OFF states respectively corresponding to performance and non-performance of an application of a correction with respect to the electrochemical model, based on state information of the battery estimated using the electrochemical model; and
determine, in the OFF state, a degree to which the state information of the battery was corrected in the ON state.

20. The mobile device of claim 19, wherein a diagonal length of the display is 10 centimeters (cm) to 70 cm.

21. The mobile device of claim 19, wherein the diagonal length of the display is 50 cm or less.

22. The mobile device of claim 19, wherein a unit cell capacity of the battery is 10 ampere hours (Ah) or less.

23. The mobile device of claim 19, wherein the processor is a micro controller unit (MCU).

24. The mobile device of claim 19, wherein a capacity of a volatile memory included in the memory is 2 to 8 kilobytes per unit cell.

25. The mobile device of claim 19, wherein a capacity of a non-volatile memory included in the memory is 20 to 100 kilobytes per unit cell.

26. The mobile device of claim 19, further comprising:
a power management integrated circuit (PMIC),
wherein the memory and the processor are included in the PMIC.

27. The mobile device of claim 19, further comprising:
a power management integrated circuit (PMIC),
wherein the memory and the processor are not included in the PMIC.

28. The mobile device of claim 19, further comprising:
a camera configured to capture a user looking at the display.

29. The mobile device of claim 19, further comprising:
a cover,
wherein the battery, the memory, and the processor are disposed between the cover and the display.

30. The mobile device of claim 19, wherein the display is a touchscreen display configured to detect a touch gesture input from a user.

31. The mobile device of claim 19, further comprising:
a communicator configured to communicate with an external device,
wherein the communicator is further configured to transmit data received from the external device to the processor, and to transmit data processed by the processor to the external device.

32. The mobile device of claim 19, further comprising:
a speaker configured to output a sound according to an operation of the mobile device.

33. The method of claim 1, wherein the application of the correction corrects an internal state of the electrochemical model when an error between the estimated voltage of the battery and the measured voltage of the battery occurs.

* * * * *